US012125707B2

(12) United States Patent
Lin et al.

(10) Patent No.: US 12,125,707 B2
(45) Date of Patent: Oct. 22, 2024

(54) FIN FIELD-EFFECT TRANSISTOR DEVICE AND METHOD OF FORMING

(71) Applicant: Taiwan Semiconductor Manufacturing Co., Ltd., Hsinchu (TW)

(72) Inventors: Yu-Li Lin, Kaohsiung (TW); Chih-Teng Liao, Hsinchu (TW); Jui Fu Hsieh, Zhubei (TW); Chih Hsuan Cheng, Houlong Township (TW); Tzu-Chan Weng, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/814,607

(22) Filed: Jul. 25, 2022

(65) Prior Publication Data

US 2022/0367196 A1 Nov. 17, 2022

Related U.S. Application Data

(62) Division of application No. 16/916,465, filed on Jun. 30, 2020, now Pat. No. 11,532,481.

(51) Int. Cl.
*H01L 21/3065* (2006.01)
*H01J 37/32* (2006.01)
(Continued)

(52) U.S. Cl.
CPC .... *H01L 21/3065* (2013.01); *H01J 37/32174* (2013.01); *H01L 21/823431* (2013.01); *H01L 29/6681* (2013.01); *H01L 29/785* (2013.01)

(58) Field of Classification Search
CPC ......... H01L 21/3065; H01L 21/823431; H01L 29/6681; H01L 21/32136; H01L 29/42372; H01L 29/66545; H01L 29/6653; H01L 29/66553; H01L 29/6656; H01L 21/28132–2815; H01L 21/823468;
(Continued)

(56) References Cited

U.S. PATENT DOCUMENTS 5,573,973 A 11/1996 Sethi et al.
8,487,378 B2 7/2013 Goto et al.
(Continued)

FOREIGN PATENT DOCUMENTS

CN 111261519 A 6/2020
KR 20160007333 A 1/2016
(Continued)

*Primary Examiner* — Cuong B Nguyen
(74) *Attorney, Agent, or Firm* — Slater Matsil, LLP

(57) ABSTRACT

A method of forming a semiconductor device includes: forming a fin protruding above a substrate; forming a gate layer over the fin; and patterning the gate layer in a plasma etching tool using a plasma etching process to form a gate over the fin, where patterning the gate layer includes: turning on and off a top radio frequency (RF) source of the plasma etching tool alternately during the plasma etching process; and turning on and off a bottom RF source of the plasma etching tool alternately during the plasma etching process, where there is a timing offset between first time instants when the top RF source is turned on and respective second time instants when the bottom RF source is turned on.

20 Claims, 34 Drawing Sheets

(51) Int. Cl.
*H01L 21/8234* (2006.01)
*H01L 29/66* (2006.01)
*H01L 29/78* (2006.01)

(58) Field of Classification Search
CPC ....... H01L 21/823864; H01L 29/66689; H01L 29/66719; H01L 29/4983; H01L 29/51–518; H01L 21/823821; H01L 21/845; H01L 27/0886; H01L 27/0924; H01L 27/1211; H01L 29/41791; H01L 29/66795–66818; H01L 29/785–7856; H01L 2029/7857–7858; H01L 2924/13067; H01L 29/04–045; H01J 37/32174; H10B 12/36; H10B 12/056
See application file for complete search history.

(56) References Cited

U.S. PATENT DOCUMENTS

| | | | |
|---|---|---|---|
| 8,729,634 B2 | 5/2014 | Shen et al. | |
| 8,826,213 B1 | 9/2014 | Ho et al. | |
| 8,887,106 B2 | 11/2014 | Ho et al. | |
| 9,418,897 B1 | 8/2016 | Ching et al. | |
| 11,527,442 B2 | 12/2022 | Lin et al. | |
| 2010/0190350 A1 | 7/2010 | Yatsuda et al. | |
| 2011/0092039 A1 | 4/2011 | Kim et al. | |
| 2014/0170842 A1 | 6/2014 | Noro et al. | |
| 2014/0282326 A1 | 9/2014 | Chen et al. | |
| 2016/0013308 A1 | 1/2016 | Lee et al. | |
| 2016/0093720 A1 | 3/2016 | Chudzik et al. | |
| 2016/0254385 A1* | 9/2016 | Wen | H01L 29/66795 257/401 |
| 2017/0005005 A1* | 1/2017 | Chen | H01L 21/823431 |
| 2017/0092468 A1 | 3/2017 | Shiina et al. | |
| 2017/0110567 A1 | 4/2017 | Chen et al. | |
| 2019/0103403 A1* | 4/2019 | Chang | H01L 27/0886 |
| 2019/0157096 A1 | 5/2019 | Zhou et al. | |
| 2020/0176260 A1 | 6/2020 | Hung et al. | |
| 2020/0381536 A1* | 12/2020 | Cheng | H01L 21/823481 |
| 2021/0398777 A1 | 12/2021 | Shiina et al. | |

FOREIGN PATENT DOCUMENTS

| | | |
|---|---|---|
| KR | 101601676 B1 | 3/2016 |
| KR | 20170038142 A | 4/2017 |
| KR | 20170046057 A | 4/2017 |
| KR | 20200066539 A | 6/2020 |

* cited by examiner

| Duty Cycle (SL1-1/SL1-2) | W1(nm) | W2(nm) | W3(nm) | Fin Loss (nm) | EPI Growth (nm) | Poly Profile (W1:W2:W3) | Metal Gate Profile (W1:W2:W3) |
|---|---|---|---|---|---|---|---|
| 4%/7% (Reference) | 15.8~16.2 | 16.0~16.6 | 16.3~17.3 | 6~8 | 3.0~5.0 | 1.00:1.02:1.05 | 1.00:1.04:1.08 |
| 4%/4% | 15.8~16.2 | 16.5~17.1 | 17.8~18.8 | 1~4 | 6.0~8.0 | 1.00:1.05:1.15 | 1.00:1.08:1.22 |
| 8%/8% | 15.8~16.2 | 15.7~16.3 | 15.2~16.2 | 24~27 | -1.0~1.0 | 1.00:1.00:0.98 | 1.00:0.98:1.01 |
| 12%/12% | 15.8~16.2 | 15.2~15.8 | 13.9~14.9 | 37~40 | -4.0~-6.0 | 1.00:0.97:0.90 | 1.00:0.96:0.85 |

Figure 22

FIN FIELD-EFFECT TRANSISTOR DEVICE AND METHOD OF FORMING

PRIORITY CLAIM AND CROSS-REFERENCE

This application is a divisional of U.S. patent application Ser. No. 16/916,465, filed on Jun. 30, 2020 and entitled "Fin Field-Effect Transistor Device and Method of Forming," which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a semiconductor fin protruding from a substrate. A gate structure, configured to control the flow of charge carriers within a conductive channel of the FinFET device, wraps around the semiconductor fin. For example, in a tri-gate FinFET device, the gate structure wraps around three sides of the semiconductor fin, thereby forming conductive channels on three sides of the semiconductor fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 22 illustrates the effects on the structure of the FinFET device 100 by adjusting the duty cycles of the RF sources of the plasma etching tool used for forming the gate structures, in some embodiments.

DETAILED DESCRIPTION

Figure 1:
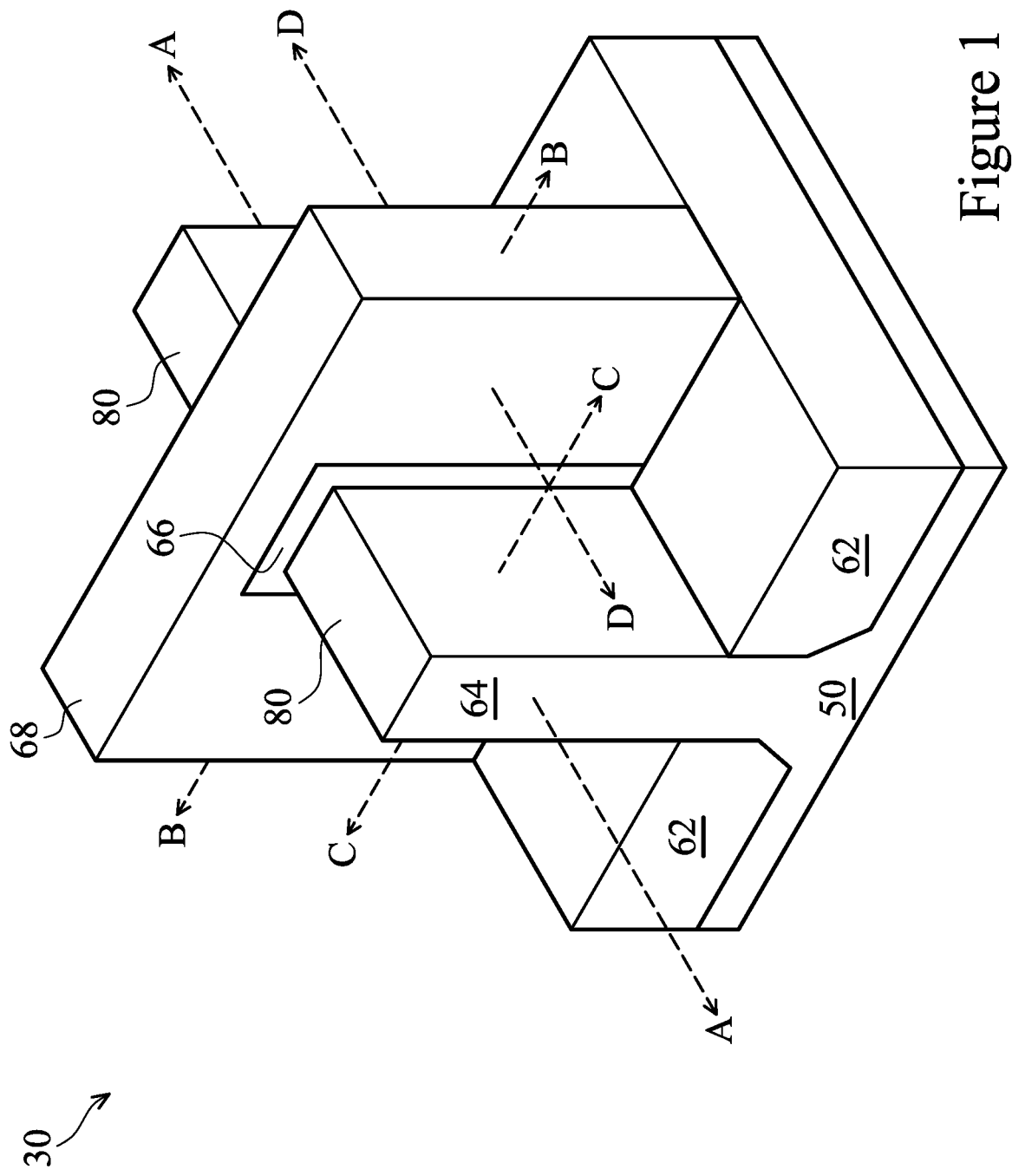
FIG. 1 illustrates a perspective view of a Fin Field-Effect Transistor (FinFET) device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the discussion herein, unless otherwise described, the same or similar reference numerals in different figures refer to the same or similar component formed by a same or similar formation process using a same or similar material(s). In addition, figures with a same numeral but different letters (e.g., 14A and 14B) illustrate various views of a same device at a same processing stage.

Embodiments of the present disclosure are discussed in the context of forming a FinFET device, and in particular, in the context of controlling (e.g., adjusting) the profile (e.g., shape, volume) of epitaxial source/drain regions of a FinFET device by controlling the amount of fin loss during formation of the gate structure (e.g., a dummy gate structure). Although the disclosed embodiments are discussed using FinFET devices as examples, the disclosed method may also be used in other types of devices, such as planar devices.

FIG. 1 illustrates an example of a FinFET 30 in a perspective view. The FinFET 30 includes a substrate 50 and a fin 64 protruding above the substrate 50. Isolation regions 62 are formed on opposing sides of the fin 64, with the fin 64 protruding above the isolation regions 62. A gate dielectric 66 is along sidewalls and over a top surface of the fin 64, and a gate 68 is over the gate dielectric 66. Source/drain regions 80 are in the fin 64 and on opposing sides of the gate dielectric 66 and the gate 68. FIG. 1 further illustrates reference cross-sections that are used in later figures. Cross-section B-B extends along a longitudinal axis of the gate 68 of the FinFET 30. Cross-section A-A is perpendicular to cross-section B-B and is along a longitudinal axis of the fin 64 and in a direction of, for example, a current flow between the source/drain regions 80. Cross-section C-C is parallel to cross-section B-B and is across the source/drain region 80.

Cross-section D-D is parallel to cross-section A-A, but outside boundaries (e.g., sidewalls) of the fin 64. Subsequent figures refer to these reference cross-sections for clarity.

Figure 2:
FIGS. 2-13 and 14A-14C illustrate various views of a FinFET device 100 at various stages of fabrication, in accordance with an embodiment.
Figure 3:
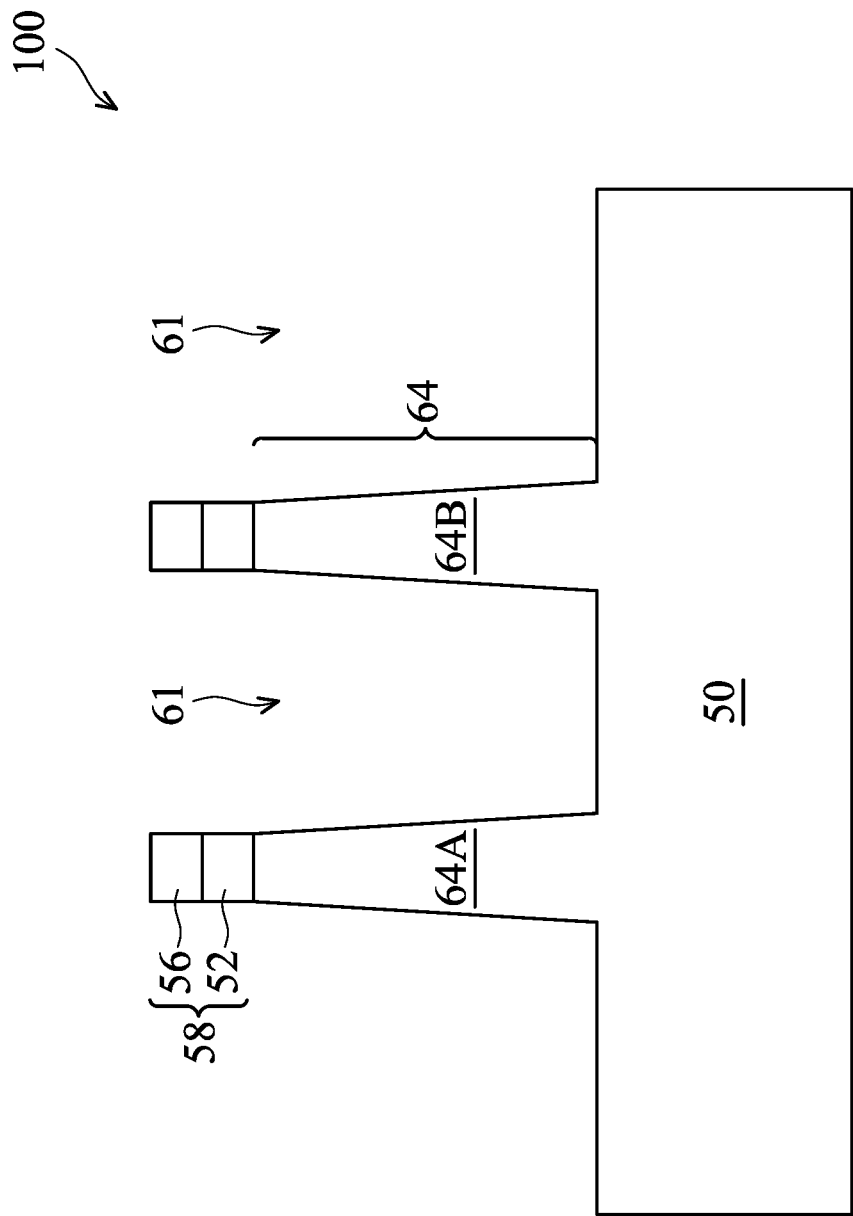
Figure 4:
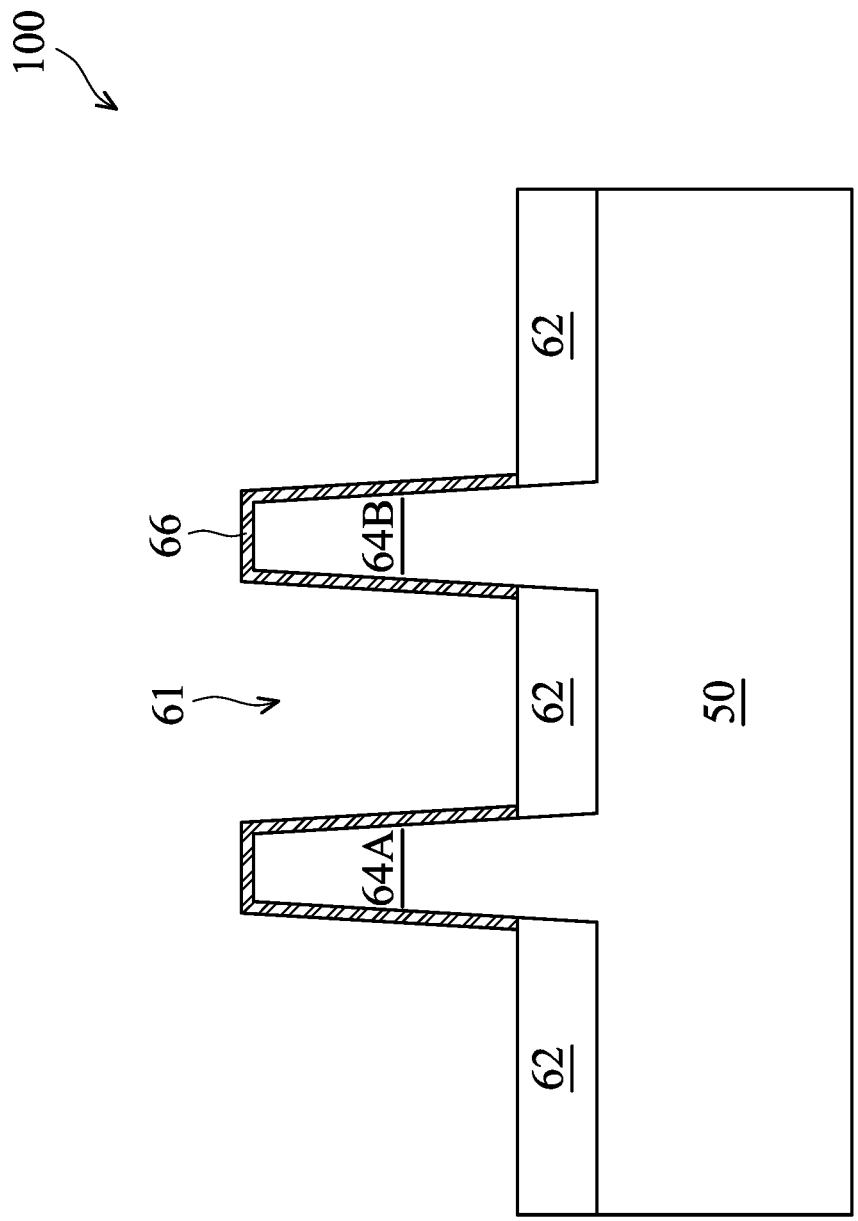

FIGS. 2-13 and 14A-14C illustrate various views (e.g., cross-sectional views, perspective views) of a FinFET device 100 at various stages of fabrication, in accordance with an embodiment. The FinFET device 100 is similar to the FinFET 30 in FIG. 1, but with multiple fins and multiple gate structures. FIGS. 2-4 illustrate cross-sectional views of the FinFET device 100 along cross-section B-B. FIGS. 5-13 and 14A illustrate cross-sectional views of the FinFET device 100 along cross-section A-A. FIG. 14B illustrates a cross-sectional view of the FinFET device 100 along cross-section B-B. FIG. 14C illustrates a perspective view of the FinFET device 100.

FIG. 2 illustrates a cross-sectional view of the substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Referring to FIG. 3, the substrate 50 shown in FIG. 2 is patterned using, for example, photolithography and etching techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride layer 56 to form a patterned mask 58, as illustrated in FIG. 3.

The patterned mask 58 is subsequently used to pattern exposed portions of the substrate 50 to form trenches 61, thereby defining semiconductor fins 64 (e.g., 64A and 64B) between adjacent trenches 61 as illustrated in FIG. 3. In some embodiments, the semiconductor fins 64 are formed by etching trenches in the substrate 50 using, for example, reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor fins 64. The semiconductor fins 64 may also be referred to as fins 64 hereinafter.

The fins 64 may be patterned by any suitable method. For example, the fins 64 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

FIG. 4 illustrates the formation of an insulation material between neighboring semiconductor fins 64 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by an FCVD process. An anneal process may be performed once the insulation material is formed. A planarization process, such as a chemical mechanical polish (CMP), may remove any excess insulation material and form top surfaces of the isolation regions 62 and top surfaces of the semiconductor fins 64 that are coplanar (not shown). The patterned mask 58 (see FIG. 3) may also be removed by the planarization process.

In some embodiments, the isolation regions 62 include a liner, e.g., a liner oxide (not shown), at the interface between the isolation region 62 and the substrate 50/semiconductor fins 64. In some embodiments, the liner oxide is formed to reduce crystalline defects at the interface between the substrate 50 and the isolation region 62. Similarly, the liner oxide may also be used to reduce crystalline defects at the interface between the semiconductor fins 64 and the isolation region 62. The liner oxide (e.g., silicon oxide) may be a thermal oxide formed through a thermal oxidation of a surface layer of substrate 50, although other suitable method may also be used to form the liner oxide.

Next, the isolation regions 62 are recessed to form shallow trench isolation (STI) regions 62. The isolation regions 62 are recessed such that the upper portions of the semiconductor fins 64 protrude from between neighboring STI regions 62. The top surfaces of the STI regions 62 may have a flat surface (as illustrated), a convex surface, a concave surface (such as dishing), or a combination thereof. The top surfaces of the STI regions 62 may be formed flat, convex, and/or concave by an appropriate etch. The isolation regions 62 may be recessed using an acceptable etching process, such as one that is selective to the material of the isolation regions 62. For example, a dry etch or a wet etch using dilute hydrofluoric (dHF) acid may be performed to recess the isolation regions 62.

After the fins 64 are formed, a gate dielectric 66 is formed over the fins 64, e.g., by a thermal oxidization process. The gate dielectric 66 is later removed in a replacement gate process, and therefore, may also be referred to as a dummy gate dielectric 66. In the example of FIG. 4, the gate dielectric 66 is shown to be formed over the fins 64 (e.g., over upper surfaces and sidewalls of the fins 64) but not over the STI regions 62. In other embodiments, the gate dielectric 66 may be formed by, e.g., depositing a gate dielectric material over the fins 64 and over the STI regions 62. These and other variations are fully intended to be included within the scope of the present disclosure.

FIGS. 2 through 4 illustrate an embodiment of forming fins 64, but fins may be formed in various different processes. For example, a top portion of the substrate 50 may be replaced by a suitable material, such as an epitaxial material suitable for an intended type (e.g., N-type or P-type) of semiconductor devices to be formed. Thereafter, the substrate 50, with epitaxial material on top, is patterned to form semiconductor fins 64 that comprise the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 64 may comprise silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

FIGS. 5-14A illustrate the formation of dummy gate 68 over the semiconductor fins 64 using a double-patterning technique. Dummy gate 68 and dummy gate dielectric 66 are collectively referred to as dummy gate structure 75 in the discussion herein. Note that for simplicity, not all features are illustrated in FIGS. 5-14A. For example, the substrate 50 of the FinFET device 100 are not illustrated in FIGS. 5-14A.

Figure 5:
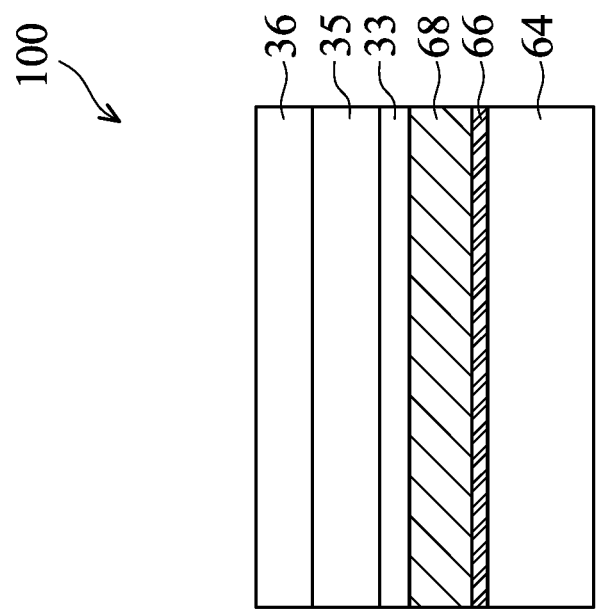

Referring now to FIG. 5, a gate layer 68, which may be a semiconductor layer such as an amorphous-silicon (a-Si) layer, is formed over the gate dielectric 66. Next, a dielectric layer 33 (e.g., a silicon carbon nitride (SiCN) layer) and a dielectric layer 35 (e.g., a silicon oxide (SiO) layer) are formed successively over the gate layer 68. The dielectric layers 33 and 35 are formed of different materials, and may be used as hard mask layers and/or etch stop layers in subsequent etching processes to pattern the gate layer 68, in some embodiments. Next, a mandrel layer 36, such as an a-Si layer, is formed over the dielectric layer 35. To form each of the above layers (e.g., 68, 33, 35, and 36), a suitable deposition method, such as CVD, physical vapor deposition (PVD), atomic layer deposition (ALD), or the like, may be used.

Figure 6:
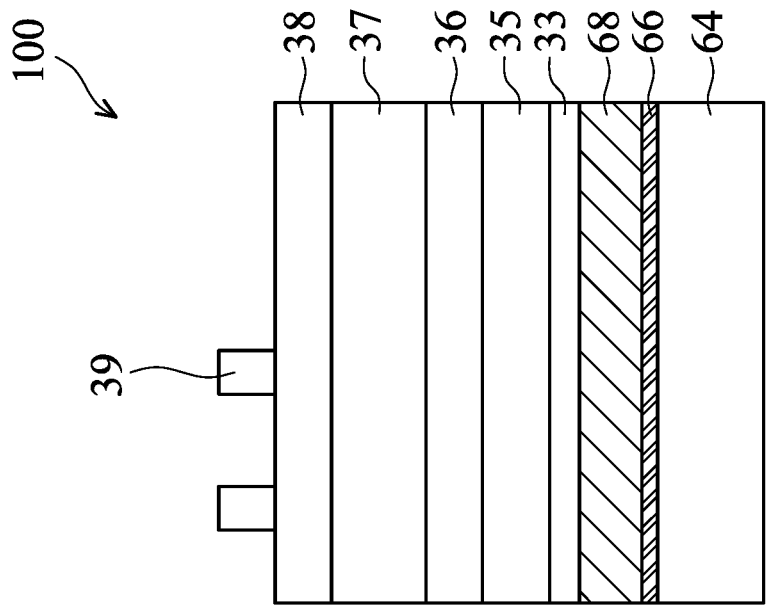

Next, in FIG. 6, a photoresist layer, such as a tri-layer photoresist layer that includes a bottom layer 37 (e.g., a bottom anti-reflective coating (BARC)), a middle layer 38 (e.g., an intermediate mask layer), and a top photoresist layer 39, is formed over the mandrel layer 36. Next, the top photoresist layer 39 is patterned, e.g., using photolithography and patterning techniques, to form a patterned top photoresist layer 39.

Figure 7:
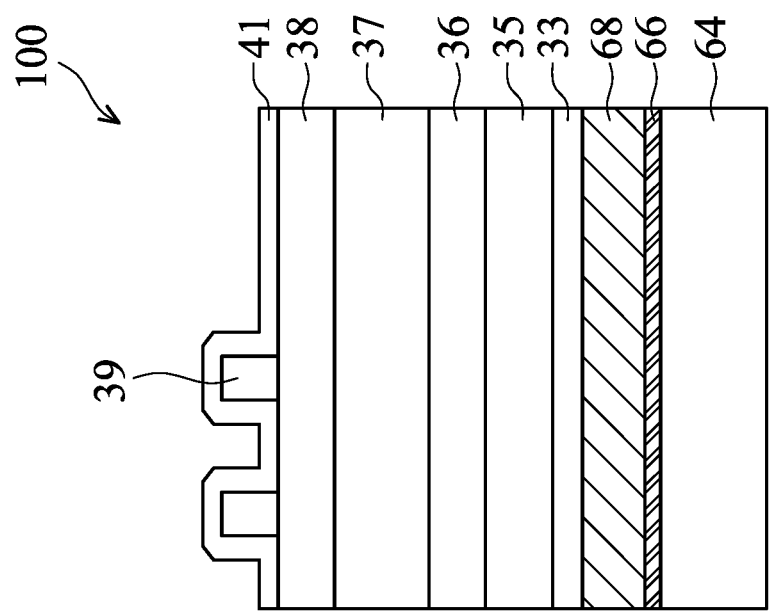

Next, in FIG. 7, an oxide layer 41 is formed conformally over the patterned top photoresist layer 39 and over the middle layer 38. In some embodiments, the oxide layer 41 is a silicon oxide layer formed by a low-temperature deposition process (e.g., a lower-temperature ALD process). A temperature of the low-temperature deposition process is between about 80° C. and about 150° C., such as 100° C., in some embodiments. The low-temperature used in the deposition process help to avoid damage to the patterned top photoresist layer 39. A thickness of the oxide layer 41 may be between a few angstroms and tens of angstroms (e.g., between 2 angstroms and 20 angstroms), as an example. In some embodiments, the oxide layer 41 protects/reinforces the sidewalls of the pattern top photoresist layer 39, such as after a subsequent etching process (which uses the patterned top photoresist layer 39 as an etching mask), the mandrels 36 (see FIG. 8) formed has smooth (e.g., straight) sidewalls.

Figure 8:
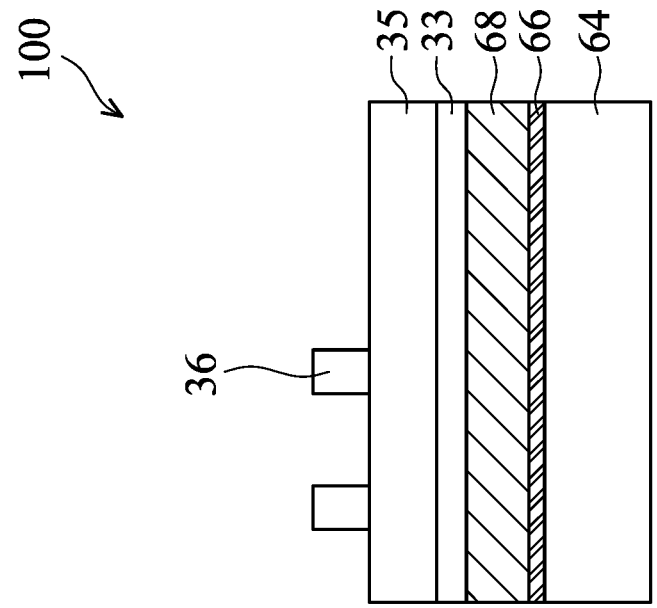

Next, in FIG. 8, one or more anisotropic etching processes, such as dry etching (e.g., plasma etching), are performed to pattern the mandrel layer 36, and after the anisotropic etching process, the patterned mandrel layer form mandrels 36. As illustrated in FIG. 8, the patterns of the patterned top photoresist layer 39 are transferred to the mandrels 36.

Figure 9:
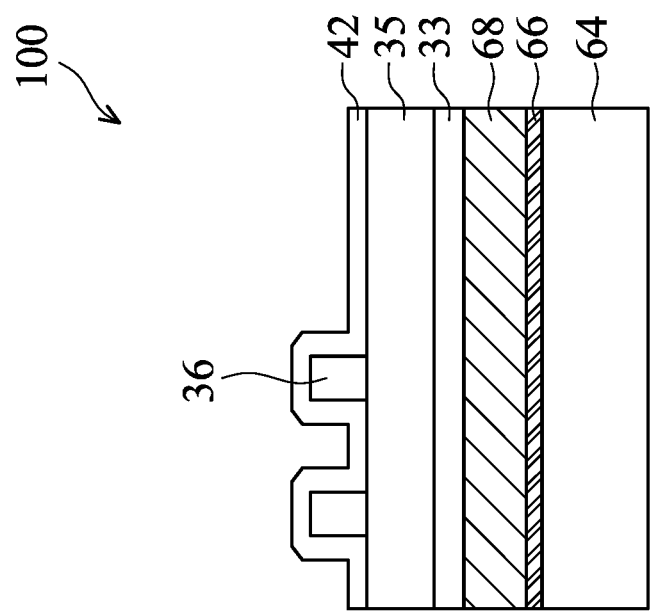

Next, in FIG. 9, a spacer layer 42 is conformally formed over the mandrels 36 and over the dielectric layer 35. The spacer layer 42 is a silicon nitride layer formed by a suitable formation method such as PVD, CVD, ALD, or the like, in some embodiments. A thickness of the spacer layer 42 may be, e.g., about 260 angstroms, as an example.

Figure 10:
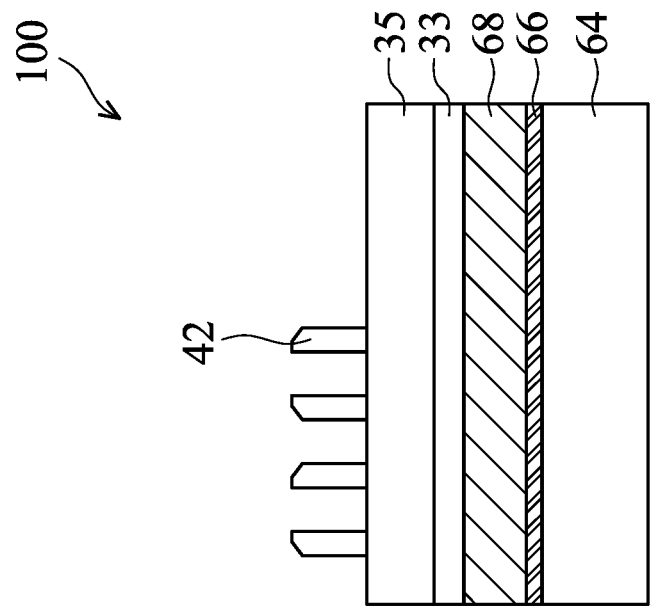

Next, in FIG. 10, an isotropic etching process is performed to remove horizontal portions of the spacer layer 42 (e.g., portions over the upper surface of the mandrels 36 and over the upper surface of the dielectric layer 35). The isotropic etching process also removes mandrels 36. Remaining portions of the spacer layer 42 that were disposed along sidewalls of the mandrel 36 form spacers 42.

Figure 11:
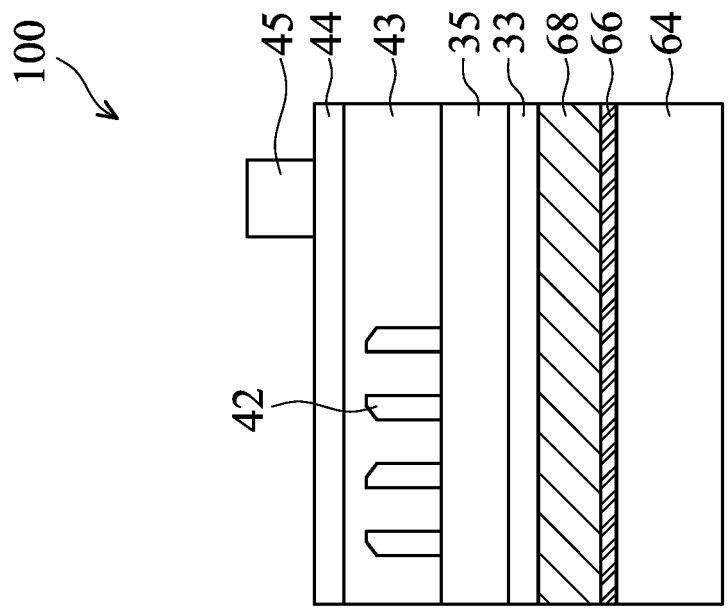

Next, in FIG. 11, a photoresist layer (e.g., a tri-layer photoresist layer), which may include bottom layer 43, a middle layer 44, and a top photoresist layer 45, is formed over the structure of FIG. 10. The top photoresist layer 45 is then patterned, e.g., using photolithography and etching techniques. In the example of FIG. 11, a width of the patterned top photoresist layer 45 (e.g., a distance between its sidewalls) is larger than a width of the spacers 42, such that dummy gate (see 68A and 68B in FIG. 14A) with different widths may be formed, which could advantageously accommodate different design requirements to achieve different performance targets for devices formed in different areas of the FinFET device 100.

Figure 12:
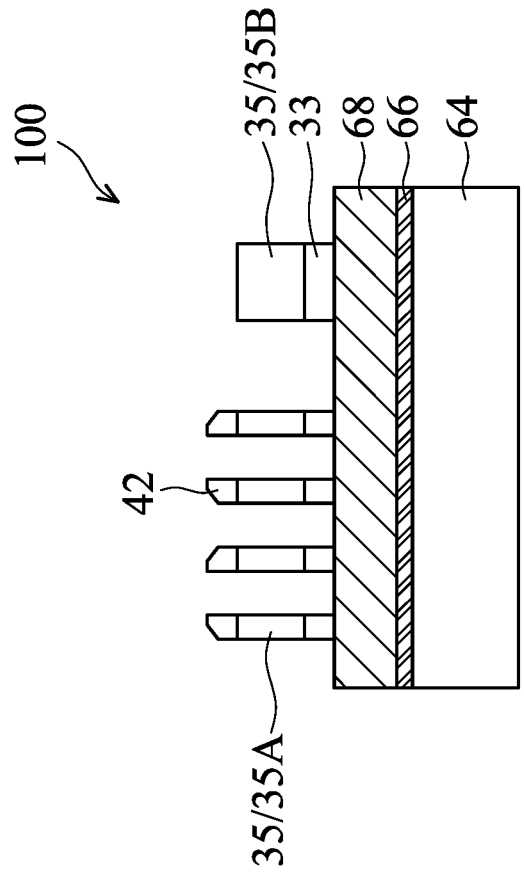

Next, in FIG. 12, an anisotropic etching process (e.g., plasma etching process) is performed to transfer the pattern of the spacers 42 and the patterned top photoresist layer 45 to the dielectric layers 35 and 33. As illustrated in FIG. 12, portions of the spacers 42 may remain over the patterned dielectric layer 35.

Figure 13:
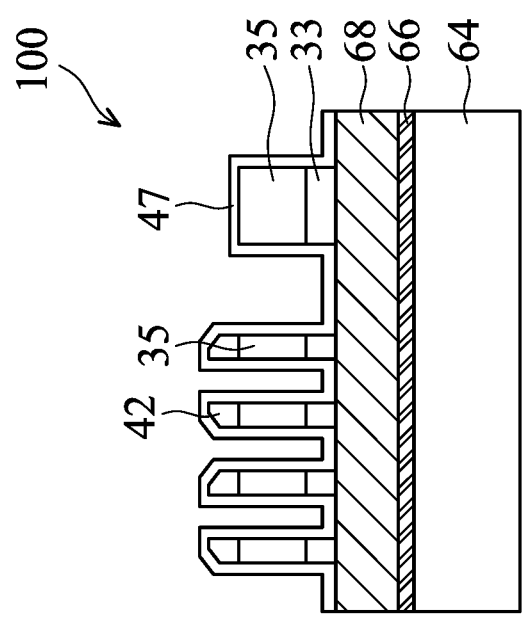

Next, in FIG. 13, an oxide capping layer 47 (e.g., a silicon oxide layer) is formed conformally over the structure of FIG. 12 using a suitable deposition such as ALD, PVD, CVD, or the like. Unlike the oxide layer 41 in FIG. 7, the oxide capping layer 47 is not formed over a photoresist layer, and therefore, a high-temperature deposition process (e.g., between 300° C. and about 500° C.) may be performed to form the oxide capping layer 47 and to achieve faster deposition rate. A thickness of the oxide capping layer 47 may be between a few angstroms and tens of angstroms, such as about 20 angstroms, as an example. In some embodiments, the oxide capping layer 47 protects/reinforces the sidewalls of the pattern dielectric layer 33/35, such as after a subsequent etching process, the gate 68 (see FIG. 14A) formed has improved profile with smooth (e.g., straight) sidewalls.

Figure 14A:
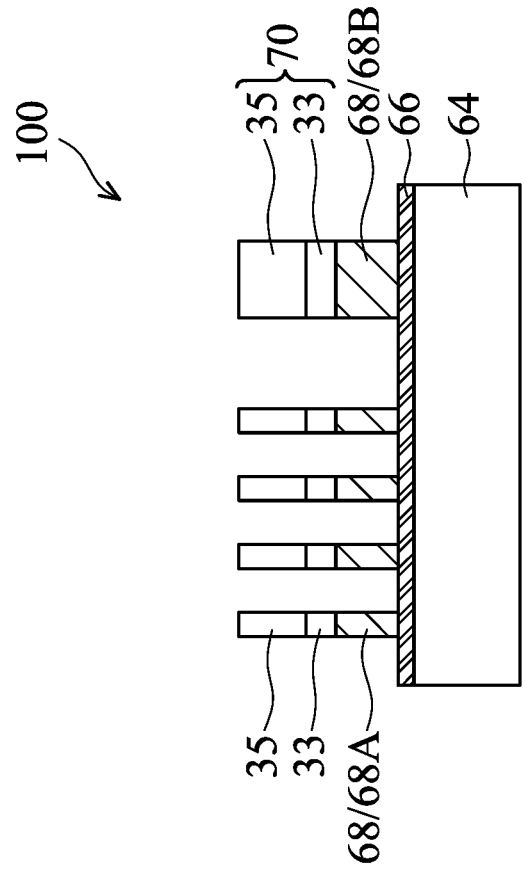
Figure 14B:
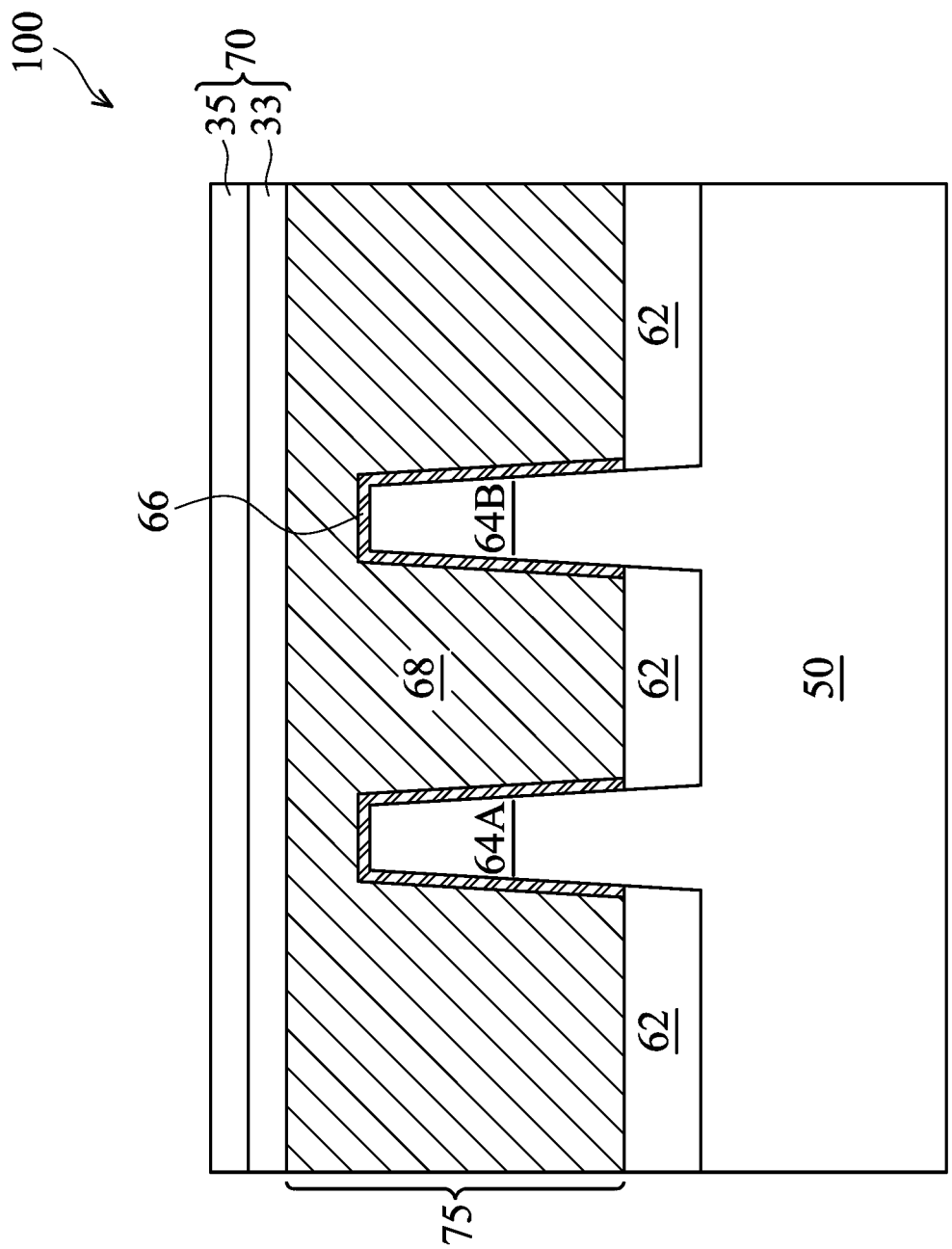
Figure 14C:
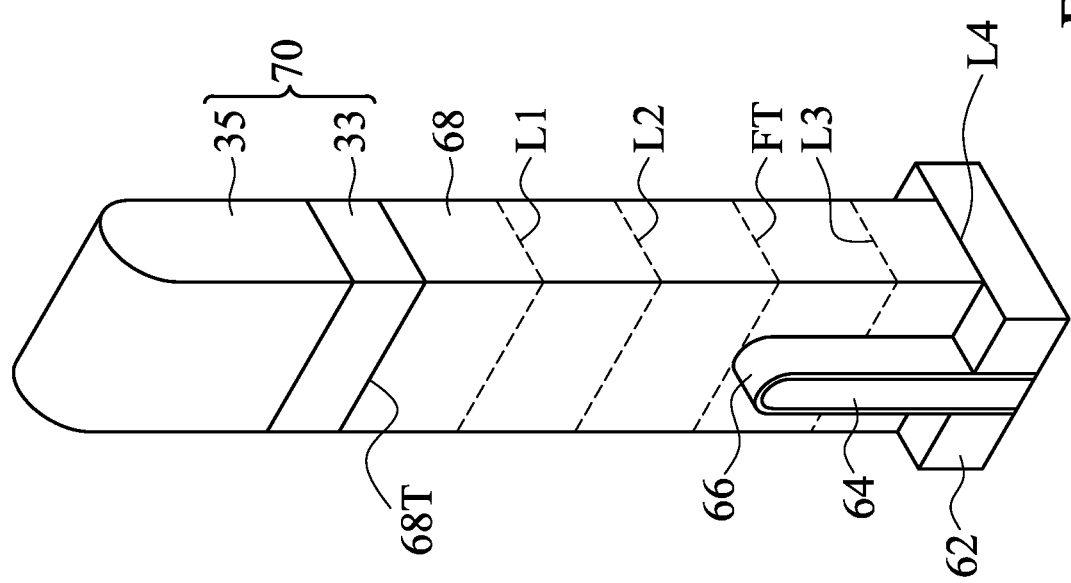

Next, in FIG. 14A, an anisotropic etching process is performed to pattern the gate layer 68. The patterned dielectric layers 35 and 33 function as a mask 70 in the anisotropic etching process to pattern the gate layer 68. After the anisotropic etching process, remaining portions of the gate layer 68 form dummy gates 68 (e.g., 68A and 68B). Note that the dummy gate 68B has a larger width than the dummy gate 68A, as discussed above, to accommodate different design requirements. For simplicity, dummy gates 68 are shown as having a same width in subsequent figures, with the understanding that dummy gates 68 may have different widths in different areas of the device. After the anisotropic etching process, the gate dielectric 66 is exposed. FIG. 14B illustrates the FinFET device 100 of FIG. 14A along cross-section B-B. FIG. 14C illustrates a perspective view of the FinFET device 100.

In some embodiments, the anisotropic etching process to pattern the gate layer 68 is a plasma etching process that includes multiple etching steps performed in series, and therefore, may also be referred to as a multi-step plasma etching process. Details of this multi-step plasma etching process are discussed hereinafter with reference to FIGS. 14C and 15-20.

In FIG. 14C, four different locations L1, L2, L3, and L4 along a vertical direction of the dummy gate 68 are illustrated, where each of the locations L1, L2, L3, and L4 corresponds to a plane parallel to the substrate 50 (see FIG. 14B). FIG. 14C further illustrates a fin top location FT that indicates a location of a top surface of the fin 64 distal from the substrate 50. In some embodiments, the location L1 is disposed 50 nm above the top surface of the fin 64. The location L2 is disposed 25 nm above the top surface of the fin 64. The location L3 is disposed 20 nm below the top surface of the fin 64. The location L4 is disposed 54 nm below the top surface of the fin 64.

In some embodiments, the multi-step plasma etching process includes a first etching step, a second etching step, a third etching step, a fourth etching step, a fifth etching step, and a sixth etching step. The first etching step is also referred to as a main etching 1 (ME1) step, and is performed to recess the gate layer 68 not covered by (e.g., not directly under) the mask 70 from a top surface 68T of the gate layer 68 to the location L1. In other words, the ME1 step stops when the location L1 is reached. In some embodiments, the ME1 etching step is a plasma etching process performed using a gas source comprising tetrafluoromethane ($CF_4$), hydrogen bromide (HBr), and chlorine ($Cl_2$). Compared with the third, fourth, and the fifth etching step, the ME1 etching step has a higher etch rate, and is performed to quickly remove upper portions of the gate layer 68 not covered by the mask 70.

After the ME1 etching step, a plasma process, referred to as an oxygen flush, is performed to oxidize sidewallcarbons of the gate layer 68. In some embodiments, the oxygen flush is performed by evacuating the gas, plasma, and/or byproduct(s) of the previous etching step from the processing chamber (e.g., the chamber of the plasma etching tool), then supplying an oxygen plasma to the gate layer 68, such that oxide (e.g., SiO) is formed on the exposed sidewalls of the gate layer 68. The oxide (e.g., SiO) formed by the oxygen flush may advantageously protect (e.g., strength) the sidewalls of the gate layer 68, such that the dummy gate 68 formed has improved (e.g., straighter) sidewall profile. The oxygen plasma may be evacuated from the processing chamber after the oxygen flush is finished.

Next, the second etching step, also referred to as a main etching 2 (ME2) step, is performed to further recess the gate layer 68 not covered by (e.g., not directly under) the mask 70 to the location L2. In other words, the ME2 step stops when the location L2 is reached. In some embodiments, the ME2 step is a same plasma etching process as the ME1 step, e.g., the ME2 step is performed using a gas source comprising $CF_4$, HBr, and $Cl_2$.

After the ME2 step is finished, a plasma process, referred to as a carbon dioxide ($CO_2$) flush, is performed to oxidize sidewalls of the gate layer 68. In some embodiments, the carbon dioxide flush is performed by evacuating the gas, plasma, and/or byproduct(s) of the previous etching step from the processing chamber, then supplying a plasma of carbon dioxide to the gate layer 68, such that oxide (e.g., SiO) is formed on the exposed sidewalls of the gate layer 68. The oxide (e.g., SiO) formed by the carbon dioxide flush may advantageously protect (e.g., strength) the sidewalls of the gate layer 68, such that the dummy gate 68 formed has improved (e.g., straighter) sidewall profile. The carbon dioxide plasma may be evacuated from the processing chamber after the carbon dioxide flush is finished.

Next, the third etching step, also referred to as a smooth landing 1-1 (SL1-1) step, is performed to further recess the gate layer 68 not covered by (e.g., not directly under) the mask 70 to the location L3. In other words, the SL1-1 step stops when the location L3 is reached. In some embodiments, the SL1-1 step is a plasma etching process performed using a gas source comprising HBr and $Cl_2$. Note that the gas source $CF_4$ used in the ME1 and ME2 steps is not used in the SL1-1 step, which results in a slower etching rate but better control of the sidewall profile of the dummy gate 68 formed.

In some embodiments, during the SL1-1 step, the power of a top RF power source 113 (see FIG. 15) of a plasma etching tool 200 used for the multi-step plasma etching process is between about 250 W and about 350 W, and a power of a bottom RF power source 117 (see FIG. 15), also referred to as a bias power, is between about 800 W and about 900 W. Details of the plasma etching tool 200, the top RF power source 113, and the bottom RF power source 117 are discussed below with reference to FIGS. 15-20. In addition, during the SL1-1 step, the volume percentage of HBr in the gas source (e.g., a mixture of HBr and $Cl_2$) is between about 60% and about 88%, and the volume percentage of $Cl_2$ in the gas source is between about 12% and about 40%.

After the SL1-1 step is finished, a plasma process, referred to as nitrogen flush, is performed to form nitride (e.g., SiN) on the sidewalls of the gate layer 68. In some embodiments, the nitrogen flush is performed by evacuating the gas, plasma, and/or byproduct(s) of the previous etching step from the processing chamber, then supplying a plasma of nitrogen to the gate layer 68, such that nitride (e.g., SiN)

is formed on the exposed sidewalls of the gate layer 68. The nitride (e.g., SiN) formed by the nitrogen flush may advantageously protect (e.g., strength) the sidewalls of the gate layer 68, such that the dummy gate 68 formed has improved (e.g., straighter) sidewall profile. The nitrogen plasma may be evacuated from the processing chamber after the nitrogen flush is finished.

In some embodiments, byproducts, such as polymers, are produced and deposited along sidewalls of the gate layer 68 during the oxygen flush, the carbon dioxide flush, and the nitrogen flush processes. These byproducts may function as a protection layer on the sidewalls of the gate layer 68, but may also be more difficult to remove for the plasma etching process (e.g., SL1-1, SL1-2). For advanced semiconductor processing techniques, the space between adjacent fins 64 is getting smaller and smaller, and it is increasingly difficult for a plasma etching process (e.g., SL1-1 or SL1-2) to reach the bottom of the narrow space between adjacent fins 64. In other words, the plasma etching process may be less effective (e.g., having lower etch rate) at the bottom of the narrow space between adjacent fins 64. To compensate for the reduced etch rate at the bottom of the narrow space between adjacent fins 64, the presently disclosed method uses an oxygen flush (which may produce more polymer byproducts) at the location L1, a carbon dioxide flush (which may produce less polymer byproducts) at the location L2, and a nitrogen flush (which may produce even less polymer byproducts) at the location L3. As a result, the sidewall profile of the dummy gate 68 formed is well controlled throughout the vertical direction of FIG. 14C and is able to achieve a target sidewall profile and performance requirements.

Next, the fourth etching step, also referred to as a smooth landing 1-2 (SL1-2) step, is performed to further recess the gate layer 68 not covered by (e.g., not directly under) the mask 70 to the location L4. In other words, the SL1-2 step stops when the location L4 is reached. In some embodiments, the SL1-2 step is a plasma etching process performed using a gas source comprising HBr and $Cl_2$.

In some embodiments, during the SL1-2 step, a power of the top RF power source 113 of the plasma etching tool used for the multi-step plasma etching process is between about 250 W and about 350 W, and a power of the bottom RF power source 117 is between about 600 W and about 700 W. In addition, during the SL1-2 step, the volume percentage of HBr in the gas source (e.g., a mixture of HBr and $Cl_2$) is between about 40% and about 60%, and the volume percentage of $Cl_2$ in the gas source is between about 40% and about 60%.

The mixing ratio between HBr and $Cl_2$ in the gas source, which may be calculated as a ratio between a flow rate of HBr and a flow rate of $Cl_2$, may be different for the SL1-1 step and SL1-2 step, in order to achieve a target sidewall profile of the dummy gate 68. For example, to achieve a sidewall profile for the dummy gate 68 that is wider (e.g., having a wider width between opposing sidewalls) at the lower portion (see 68L in FIG. 23) and narrower (e.g., having a narrow width between opposing sidewalls) at the upper portion (see 68U in FIG. 23), the mixing ratio between HBr and $Cl_2$ for the SL1-1 step may be adjusted to 8:1, and the mixing ratio between HBr and $Cl_2$ for the SL1-2 step may be adjusted to 1.8:1.

As another example, to achieve a sidewall profile for the dummy gate 68 that has a same width between opposing sidewalls at the upper portion (see 68U in FIG. 24) and at the lower portion (see 68L in FIG. 24), the mixing ratio between HBr and $Cl_2$ for the SL1-1 step may be adjusted to 3:1, and the mixing ratio between HBr and $Cl_2$ for the SL1-2 step may be adjusted to 1:1.

As yet another example, to achieve a sidewall profile for the dummy gate 68 that is narrower at the lower portion (see 68L in FIG. 25) and wider at the upper portion (see 68U in FIG. 25), the mixing ratio between HBr and $Cl_2$ for the SL1-1 step may be adjusted to 1.6:1, and the mixing ratio between HBr and $Cl_2$ for the SL1-2 step may be adjusted to 0.6:1.

Still referring to FIG. 14C, after the SL1-2 step is finished, the fifth etching step, also referred to as a smooth landing 2 (SL2) step, is performed to remove remaining portions of the gate layers 68 that are disposed between adjacent dummy gates 68 (e.g., remaining portions that extends along the upper surface of the isolation regions 62 between adjacent dummy gates 68), such that adjacent dummy gates 68 are separated. In some embodiments, the SL2 step is a plasma etching process performed using a gas source comprising HBr and $Cl_2$. The SL2 step is similar to the SL1-2 step, but with increased bias power. Details regarding effects of bias power and its control methods are discussed below with reference to FIGS. 15-20.

Next, the sixth etching step, also referred to as a de-footing (DF) step, is performed to remove portions of the gate layer 68 that are at the bottom of the dummy gate 68 (e.g., at locations where the dummy gate 68 contacts the isolation regions 62) and outside sidewalls of the dummy gate 68. In some embodiments, the DF step is a plasma etching process performed using a gas source comprising HBr. Compared with the SL1-1 and SL1-2 step, $Cl_2$ is not used in the DF step.

Figure 15:
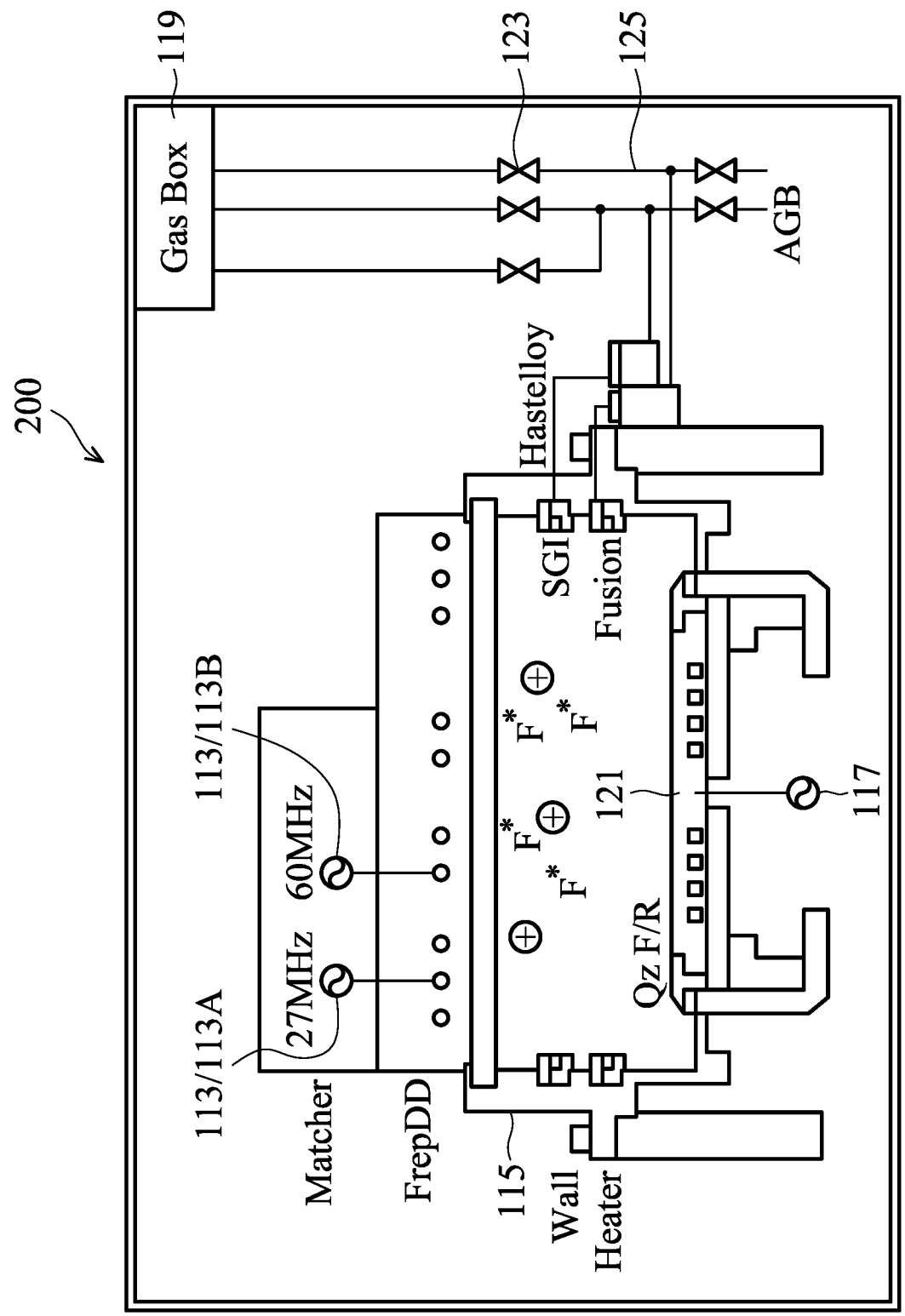
FIG. 15 illustrates a cross-sectional view of a plasma etching tool, in an embodiment.

FIG. 15 illustrates a cross-sectional view of a plasma etching tool 200, in an embodiment. The plasma etching tool 200 is used to perform the multi-step plasma etching process to form the dummy gate 68, in some embodiments. In the example of FIG. 15, the plasma etching tool 200 has a housing 115 that surrounds the processing chamber of the plasma etching tool 200. Gas tanks 119 store the process gases used in the plasma etching. The gases are fed into the processing chamber through pipes 125 and valves 123.

FIG. 15 further illustrates one or more top RF power sources 113 (also referred to as top RF sources) disposed above a cover 111 of the plasma etching tool 200. In addition, a bottom RF power source 117 (also referred to as bottom RF source) is electrically coupled to a support 121 of the plasma etching tool 200. The support 121 is used to support the wafer during the plasma etching process, where one or more FinFET devices 100 are to be formed on the wafer.

In some embodiments, the top RF power source 113, when turned on, ignites the gas source into plasma used in the plasma etching process. The bottom RF power source 117, when turned on, provides a bias voltage for the support 121, such that electrically charged particles (e.g., ions) in the plasma are attracted (e.g., by the electrical field caused by the bias voltage) toward the wafer on the support 121. The bombardment of the electrically charged particles on the wafer removes the target material (e.g., the exposed portion of the gate layer 68), in some embodiments.

FIGS. 16-20 illustrate various embodiment methods of controlling the radio frequency (RF) power sources of the plasma etching tool of FIG. 15. Each of the embodiment methods may be used to control the top RF power source 113 and the bottom RF power source 117 during the SL1-1 step and the SL1-2 step of the above described multi-step plasma etching process, although the disclosed methods may also be used to control the RF power sources for other etching steps of the multi-step plasma etching process.

Figure 16:
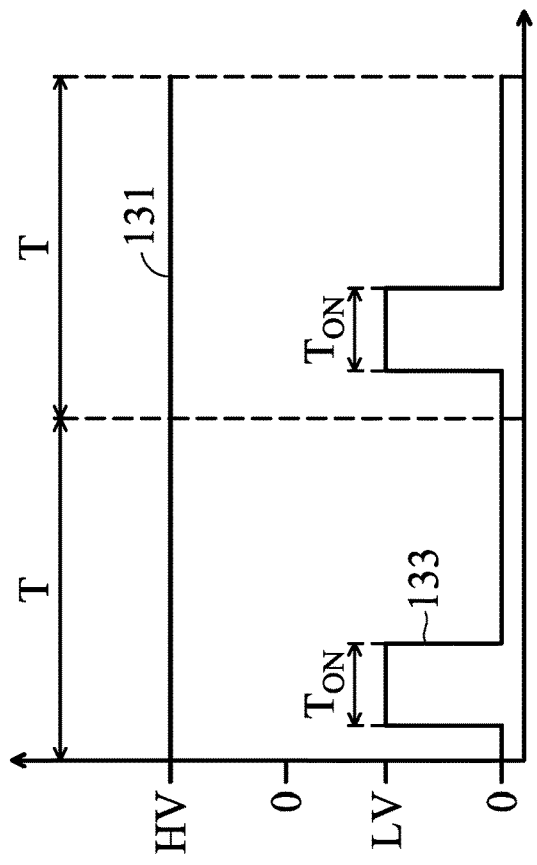

Referring now to FIG. 16, the curve 131 in FIG. 16 illustrates the power of the top RF power source 113, and the curve 133 illustrates the power of the bottom RF power source 117. In FIG. 16, the X-axis illustrates time, and the Y-axis illustrates the power. The time of the curves 131 and the time of the curve 133 are aligned along the X-axis. For clarity, each curve 131 or 133 has its own respective zero point for power along the Y-axis. In FIG. 16, the value HV corresponds to the power of the top RF power source when it is turned on, and the value LV corresponds to the power of the bottom RF power source when it is turned on.

In FIG. 16, the bottom RF power source (see the curve 133) is turned on and off periodically at a pre-determined frequency (e.g., between about 0.1 KHz and about 1 KHz) during the plasma etching step (e.g., the SL1-1 step or the SL1-2 step), and the top RF power source (see the curve 131) is turned on constantly throughout the plasma etching step. FIG. 16 shows two consecutive switching cycles for the bottom RF power source, wherein each switching cycle (also referred to as an ON-OFF cycle, or a period) has a duration T, which duration T is an inverse of the switching frequency. Throughout the discussion with reference to FIGS. 16-20, it is assumed that the top RF power source and the bottom RF power source have a same period T or a same switching frequency. As illustrated in FIG. 16, in each switching cycle, the bottom RF power source is turned on for a pre-determined duration $T_{ON}$. The duration $T_{ON}$ is also referred to as an ON-time of the corresponding RF power source (e.g., the bottom RF power source) in a switching cycle or in a period T. The ratio of $T_{ON}$ to T (e.g., $T_{ON}/T$) is referred to as the duty cycle of the corresponding RF power source (e.g., the bottom RF power source). In some embodiments, the duty cycle of the bottom RF power source is between about a few percent (e.g., 4%) and about 20%, such as 4%, 8%, or 12%.

In the embodiment of FIG. 16, during the ON-time of the bottom RF power source, a bias voltage is applied at the support 121 (see FIG. 15), and the plasma etching exhibits good anisotropicity. During the OFF-time (e.g., when the corresponding RF power source is turned off) of the bottom RF power source in each period T, the anisotropic etching stops, and there is ample time for the byproducts (e.g., polymers) of the plasma etching to be evacuated from the processing chamber of the plasma etching tool 200. Since excessive accumulation of the etching byproducts on the dummy gate 68 may adversely affect the sidewall profile of the dummy gate 68, the method of FIG. 16 (referred to as a bias pulsing method), achieves better (e.g., straight) sidewall profile for the dummy gate 68 formed, compared with a reference method where both the top RF power source and the bottom RF power source are turned on constantly throughout the etching process.

Figure 17:
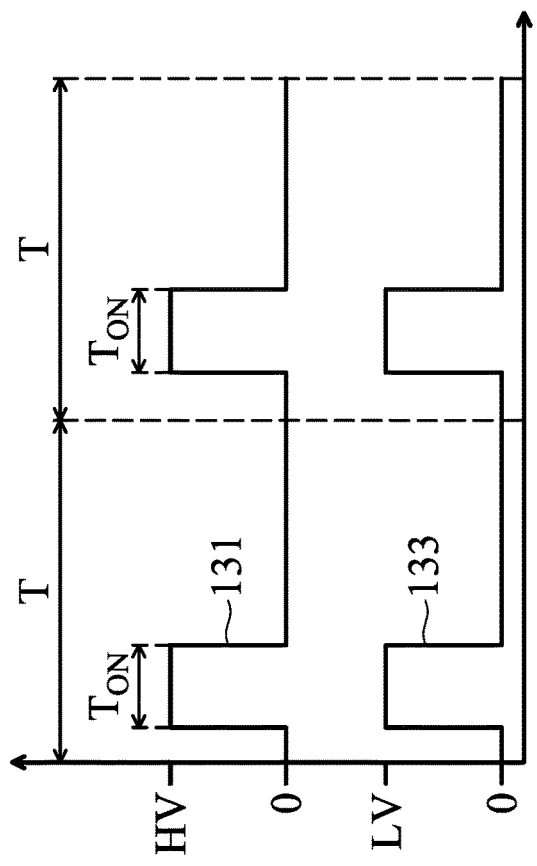
FIGS. 16-20 illustrate various embodiment methods of controlling the radio frequency (RF) power sources of the plasma etching tool of FIG. 15.

FIG. 17 shows another method (also referred to as a sync pulsing method) for controlling the top RF power source and the bottom RF power source during the plasma etching process. In FIG. 17, the top RF power source and the bottom RF power source are both turned on and off periodically. In the example of FIG. 17, the ON-time of the top RF power source (see curve 131) and the ON-time of the bottom RF power source (see curve 133) are synchronized (e.g., aligned). In other words, the top RF power source and the bottom RF power source are turned on and off at the same time, and have a same duty cycle. This means that the top RF power source generates plasma only when the bias voltage is applied at the support 121 to induce anisotropic etching, and no plasma is generated when no bias voltage is applied at the support 121. This advantageously reduces lateral etching, which may occur when the top RF power source is turned on and the bottom RF power source is turned off. As a result, the sync pulsing method illustrated in FIG. 17 may achieve improved sidewall profile (e.g., a straight sidewall profile).

Figure 18:
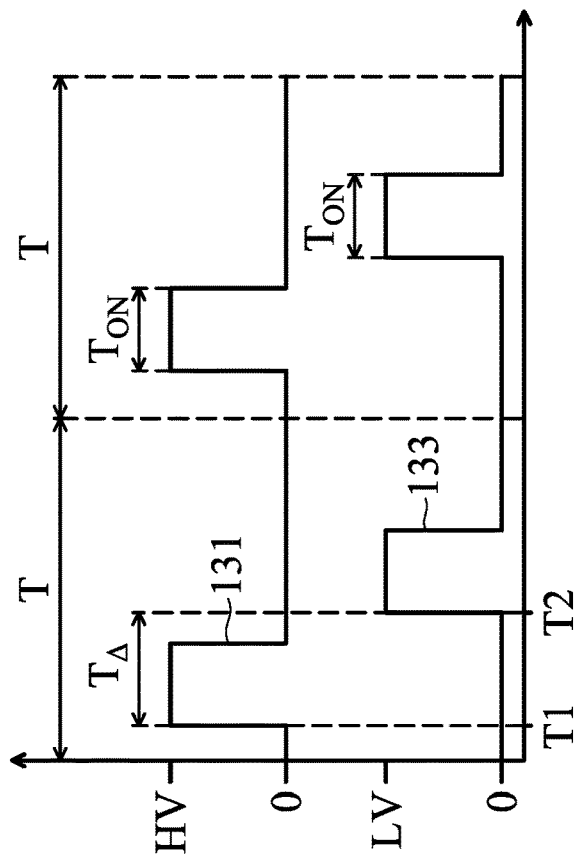

FIG. 18 shows yet another method (also referred to as a transition pulsing method) for controlling the top RF power source and the bottom RF power source during the plasma etching process. In FIG. 18, the top RF power source and the bottom RF power source are both turned on and off periodically, and have a same duty cycle. However, in the example of FIG. 18, there is a time offset $T_A$ between the ON-time of the top RF power source (see curve 131) and the ON-time of the bottom RF power source (see curve 133). In other words, the top RF power source and the bottom RF power source are turned on and off at different times in each switching cycle. In the example of FIG. 18, in each switching cycle, the top RF power source is turned on for a duration of $T_{ON}$, then turned off; after the top RF power source is turned off, the bottom RF power source is turned on for a duration of $T_{ON}$, then turned off. Therefore, there is no overlap of the ON-time between the top RF power source and the bottom RF power source in each switching cycle in FIG. 18. In other words, the time offset $T_A$ is larger than $T_{ON}$ in FIG. 18. In some embodiments, the time offset $T_A$ is between about 5% and about 15% of the duration T of each switching cycle.

The transition pulsing method disclosed herein allows some of the electrically charged particles (e.g., ions, electrons) in the plasma (which is generated when the top RF power source is turned on) to combine and become electrically neutral, thereby reducing the energy of the plasma, before the bias voltage is applied (when the bottom RF power is turned on) for anisotropic etching. If the energy of the plasma is too high, some of the electrically charged particles in the plasma may be hard to control by the electrical field caused by the bias voltage, and may travel in directions other than the direction toward the support 121 when the bias voltage is applied, thereby reducing the anisotropicity of the plasma etching process. The disclosed transition pulsing method, by lowering the energy of the plasma before applying the bias voltage, achieves improved anisotropicity for the plasma etching process and better sidewall profile for the dummy gate 68.

Figure 19:
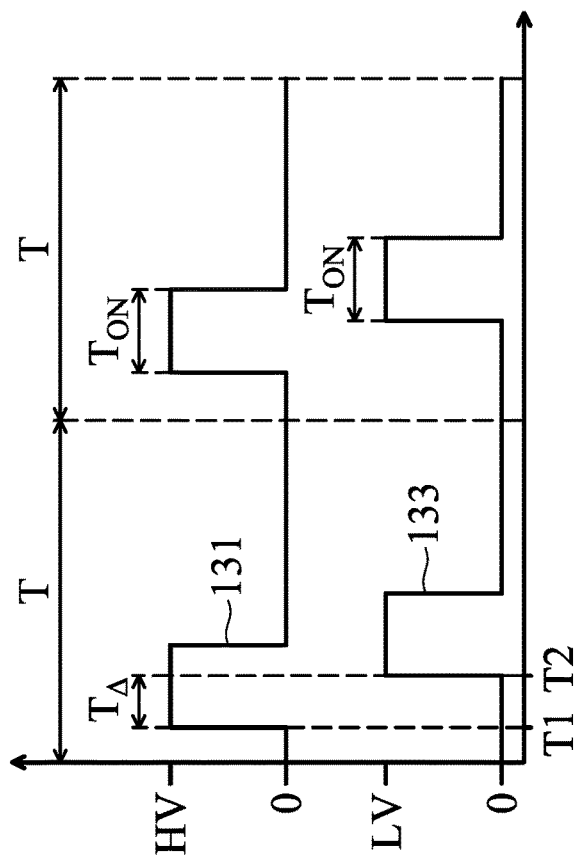
Figure 20:
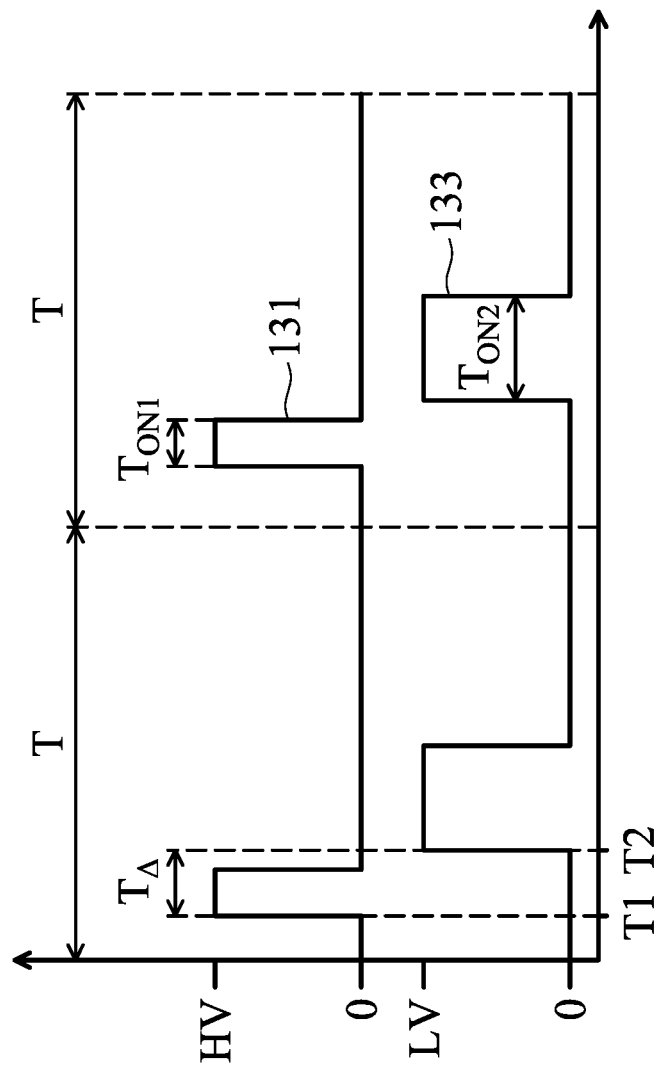

FIGS. 19 and 20 show alternative embodiments of the transition pulsing method of FIG. 18. In particular, FIG. 19 shows a transition pulsing method where the time offset $T_A$ between the ON-time of the top RF power source and the ON-time of the bottom RF power source is smaller than the duration of ON-time $T_{ON}$, and the top RF power source and the bottom RF power source have a same duty cycle. In the embodiment of FIG. 20, the top RF power source has a duty cycle (which corresponds to an ON-time Tom) that is different from (e.g., smaller than) a duty cycle of the bottom RF power source (which corresponds to an ON-time $T_{ON2}$). In FIG. 20, the time offset $T_A$ between the ON-time of the top RF power source and the ON-time of the bottom RF power source is larger than the duration of ON-time $T_{ON1}$, thus the bottom RF power source is turned on after the top RF power source is turned off. This is, of course, a non-limiting example, other relationships between the time offset $T_A$ and the ON-time $T_{ON1}$ are also possible and are fully intended to be included within the scope of the present disclosure.

Figure 21:
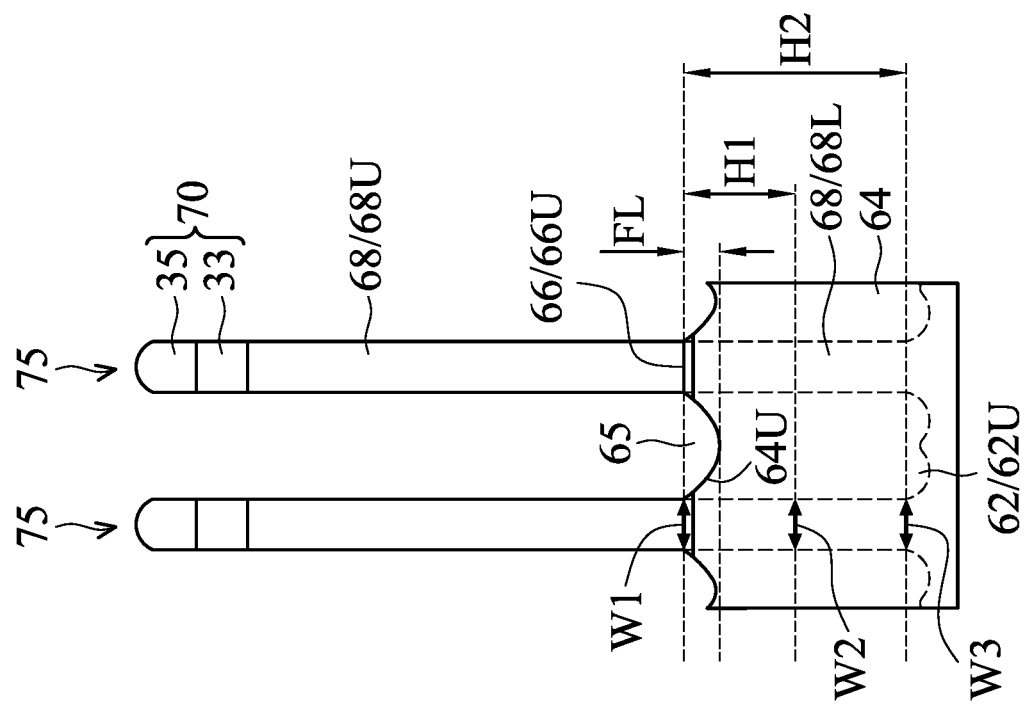
FIG. 21 illustrates a cross-sectional view of a portion of the FinFET device 100 after the processing illustrated in FIGS. 14A-14C, in an embodiment.

In some embodiments, a transition pulsing method disclosed herein (e.g., FIG. 18) is used for the SL1-1 and SL1-2 steps of the multi-step plasma etching process to form the dummy gate 68. FIG. 21 illustrates a cross-sectional view of a portion of the FinFET device 100 along cross-section A-A after the processing illustrated in FIGS. 14A-14C using the transition pulsing method for the SL1-1 and SL1-2 etching steps, in an embodiment. To illustrate the relative location of various elements of the FinFET device 100, FIG. 21 further illustrates the isolation regions 62 and lower portions 68L of the dummy gate 68 disposed outside boundaries of the fins 64 (e.g., portions along cross-section D-D), which are not in the cross-section A-A and are illustrated in phantom. Note that the lower portions 68L of the dummy gate 68 are disposed below the upper surface 66U of the gate dielectric 66 and outside boundaries of the fins 64, and the upper portion 68U of the dummy gate 68 are disposed above the upper surface 66U.

FIG. 21 shows two dummy gate structures 75, where each dummy gate structure 75 includes the dummy gate 68 and the underlying dummy gate dielectric 66. As illustrated in FIG. 21, each dummy gate 68 has a first width W1 measured at an upper surface 66U of the gate dielectric 66, a second width W2 measured at a depth of H1 (e.g., 27 nm) from the upper surface 66U, and a third width W3 measured at a depth H2 (e.g., 49 nm) from the upper surface 66U. FIG. 21 further illustrates a fin loss FL, which indicates a depth (e.g., a distance between 66U and a deepest location of the recess 65) of a recess 65 formed in the upper surface of the fin 64 between the dummy gates 68, where the recess 65 is caused by the multi-step plasma etching process for forming the dummy gates 68.

By adjusting the process parameters (e.g., duty cycles) of the plasma etching steps (e.g., the SL1-1, SL1-2), the dimensions of the dummy gate (e.g., W1 W2, and W3) and the recess 65 (e.g., FL) may be adjusted to achieve a target value(s). Note that the recess 65 will be extended further in subsequent processing in preparation for growing epitaxial source/drain regions 80 (see, e.g., FIG. 28A). Since the size of the recess 65 may determine the size (e.g., volume) of the epitaxial source/drain regions 80, the current disclosed methods (e.g., the transition pulsing method) provide an extra tuning knob for tuning the size of the recess 65 for growth of epitaxial source/drain regions 80.

As semiconductor manufacturing process continues to advance, feature sizes continue to shrink. As the distance between adjacent gates 68 becomes smaller and smaller, the spacing between the gates 68 may become a dominating factor in determining the size of the recess 65 and the volume of the epitaxial source/drain regions 80 formed subsequently. After the gates 68 are formed, there may be limited capability to adjust the size of the recess 65 for growth of epitaxial source/drain regions 80. The currently disclosed methods (see, e.g., FIGS. 16-20) allow the size of the recess 65 to be adjusted while the gates 68 are formed, therefore providing additional ways to manipulate the volume of epitaxial source/drain regions 80 by tuning the process parameters for forming the gates 68.

FIG. 22 shows the dimensions of the FinFET device 100 when the transition pulsing method is used for the SL1-1 and SL1-2 steps of the multi-step plasma etching process, in accordance with some embodiments. In FIG. 22, the EPI growth indicates the distance H3 (see FIG. 28A) between the upper surface 66U of the gate dielectric 66 and the upper surface 80U of the subsequently formed epitaxial source/drain regions 80. A positive value of H3 means that the upper surface 80U is above (e.g., further from the substrate 50) the upper surface 66U, and a negative value of H3 means that the upper surface 80U is below the upper surface 66U. FIG. 22 further shows the profile of the dummy gate 68 (labeled as Poly Profile) and the profile of the subsequently formed metal gate (labeled as Metal Gate Profile). A transition pulsing method with 4% duty cycle for the SL1-1 step and a 7% duty cycle for the SL1-2 step is used as a reference data point. The results for three additional transition pulsing methods, with duty cycles 4%, 8%, and 12% for both SL1-1 and SL1-2 steps are shown in FIG. 22. It is seen that by adjusting the duty cycles, different shapes and sizes for various features of the FinFET device 100 can be achieved.

Figure 25:
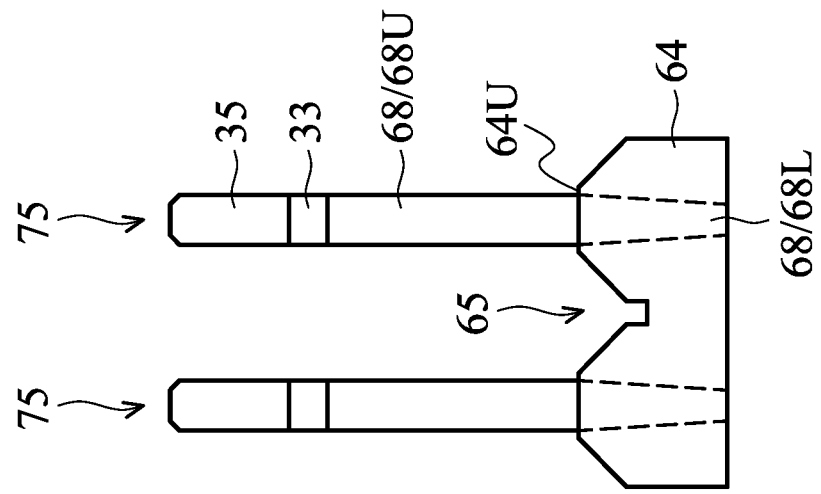
FIGS. 23-25 illustrate various embodiment cross-sectional views of gate structures formed using different duty cycles for the plasmas etching tool used for formation of the gate structures.
Figure 24:
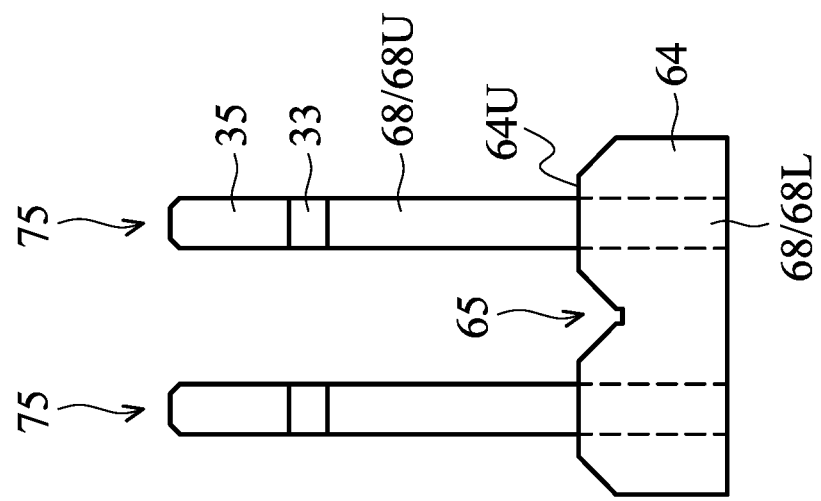
Figure 23:
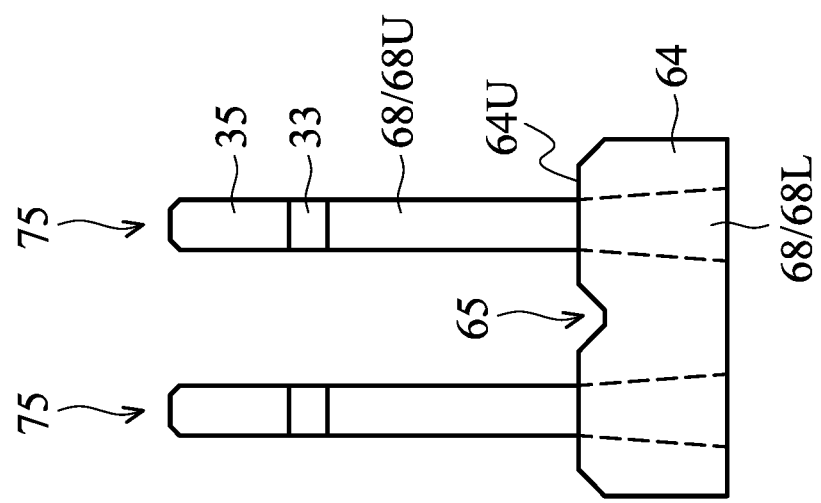

FIGS. 23-25 illustrate cross-section views of a portion of the FinFET device 100 using different process parameters (e.g., duty cycles) for the SL1-1 and SL1-2 steps. The cross-sectional views in FIGS. 23-25 are similar to FIG. 21. FIG. 23 corresponds to a duty cycle of 4% for both SL1-1 and SL1-2 steps, which corresponds to the 4%/4% example illustrated in FIG. 22. FIG. 24 corresponds to a duty cycle of 8% for both SL1-1 and SL1-2 steps, which corresponds to the 8%/8% example illustrated in FIG. 22. FIG. 25 corresponds to a duty cycle of 12% for both SL1-1 and SL1-2 steps, which corresponds to the 12%/12% example illustrated in FIG. 22. In the examples shown in FIGS. 23-25, the fin loss (e.g., depth of the recess 65) increases with the duty cycle. The dummy gates 68 have wider lower portions 68L and narrower upper portions 68U in FIG. 23. The dummy gates 68 have straight sidewalls (e.g., lower portions 68L and upper portions 68U have a same width) in FIG. 24. The dummy gates 68 have narrower lower portions 68L and wider upper portions 68U in FIG. 25.

Figure 26:
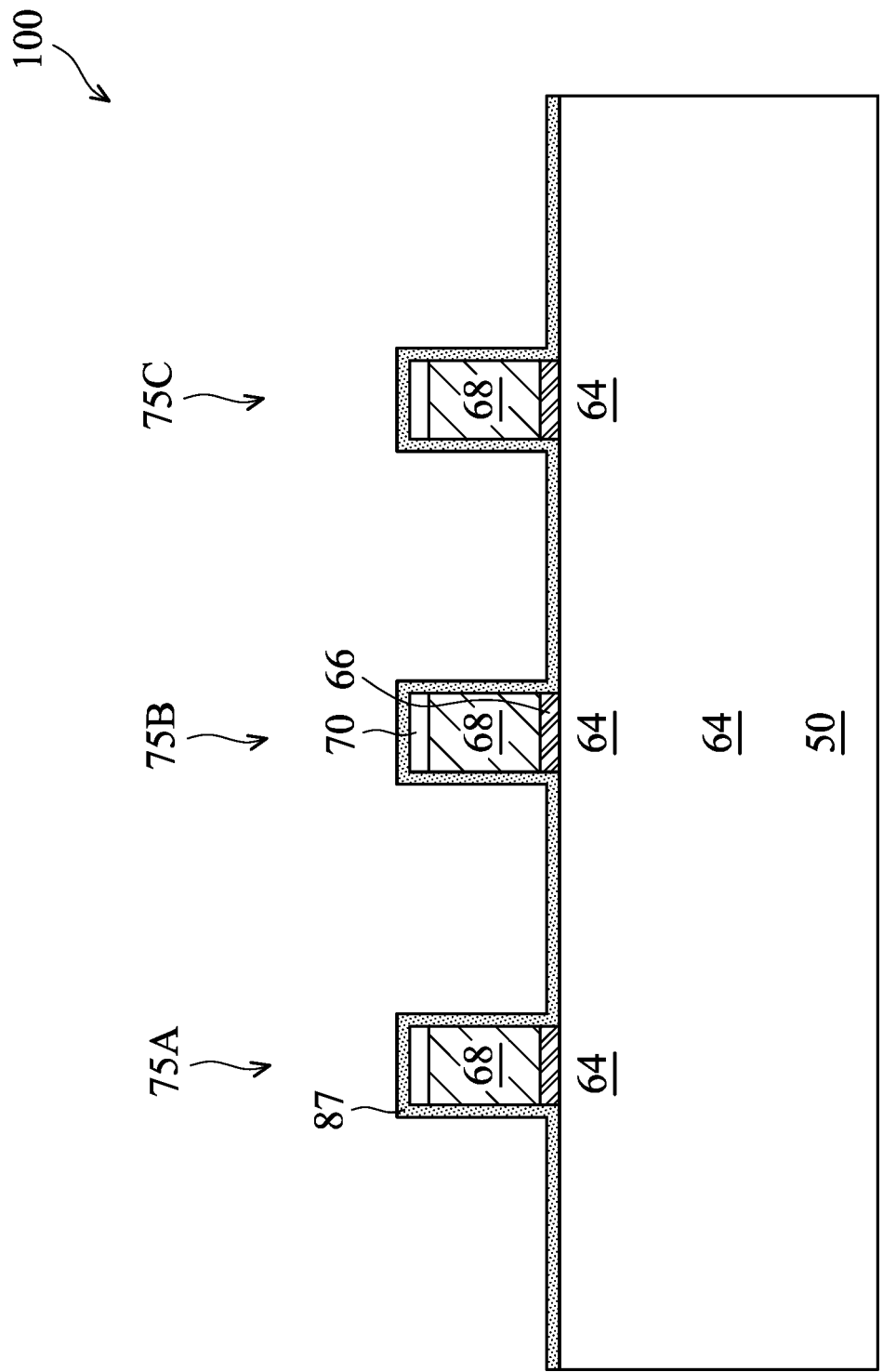
FIGS. 26, 27, 28A, 28B, 29A, 29B, 30, 31, 32A, and 32B illustrate cross-sectional views of the FinFET device 100 at additional stages of fabrication, following the processing of FIGS. 14A-14C, in accordance with an embodiment.
Figure 27:
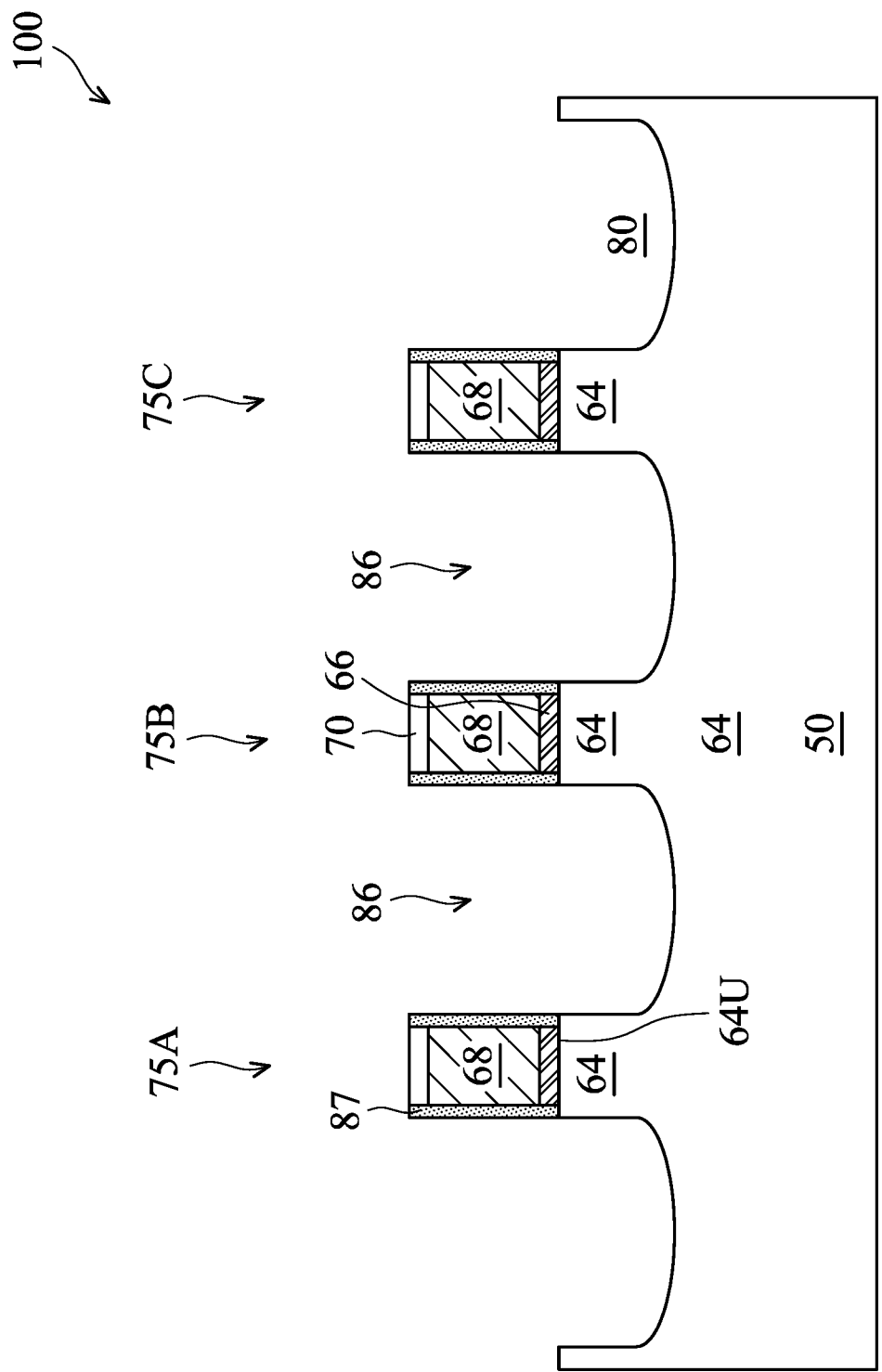
Figure 28A:
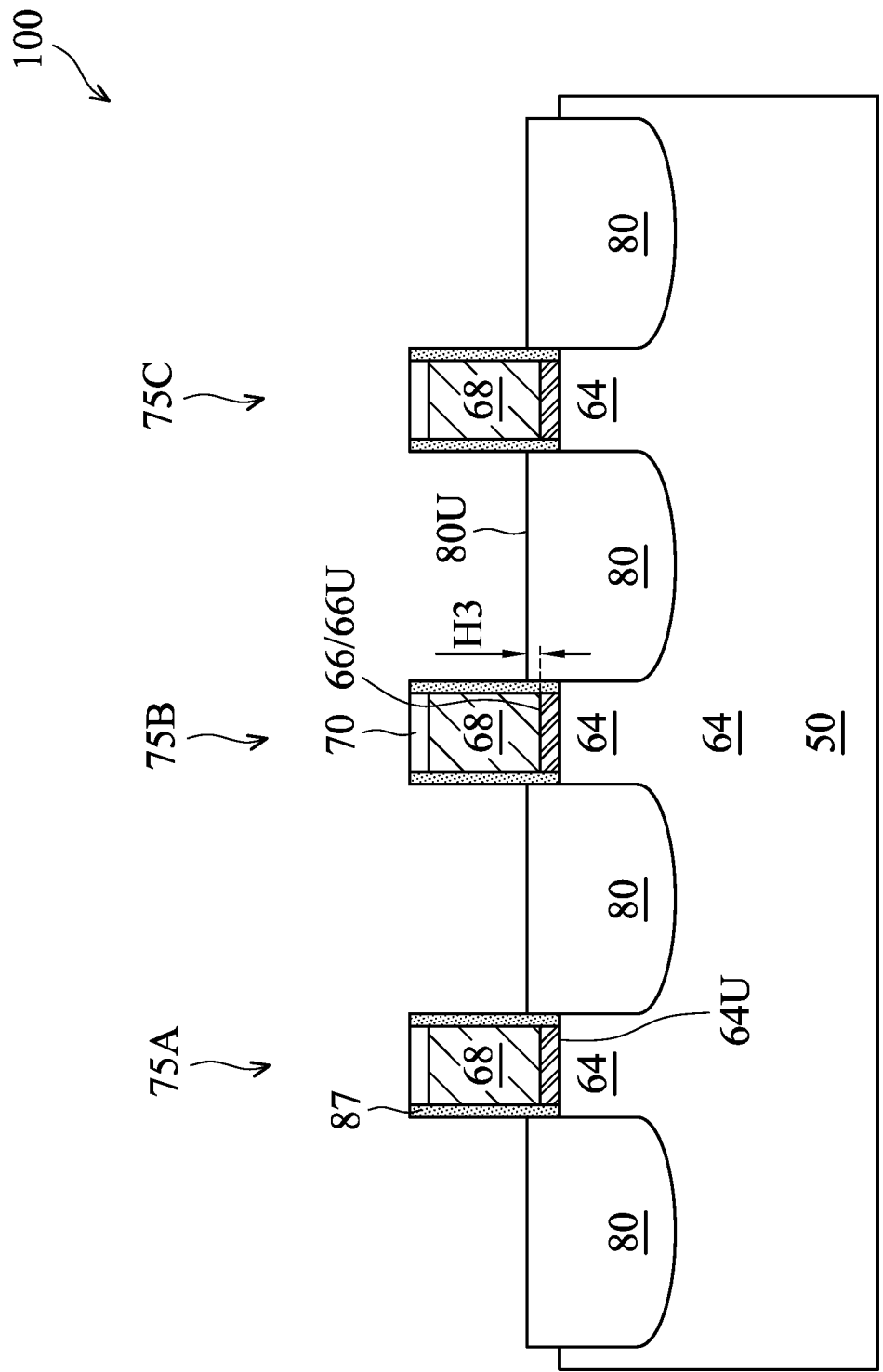
Figure 28B:
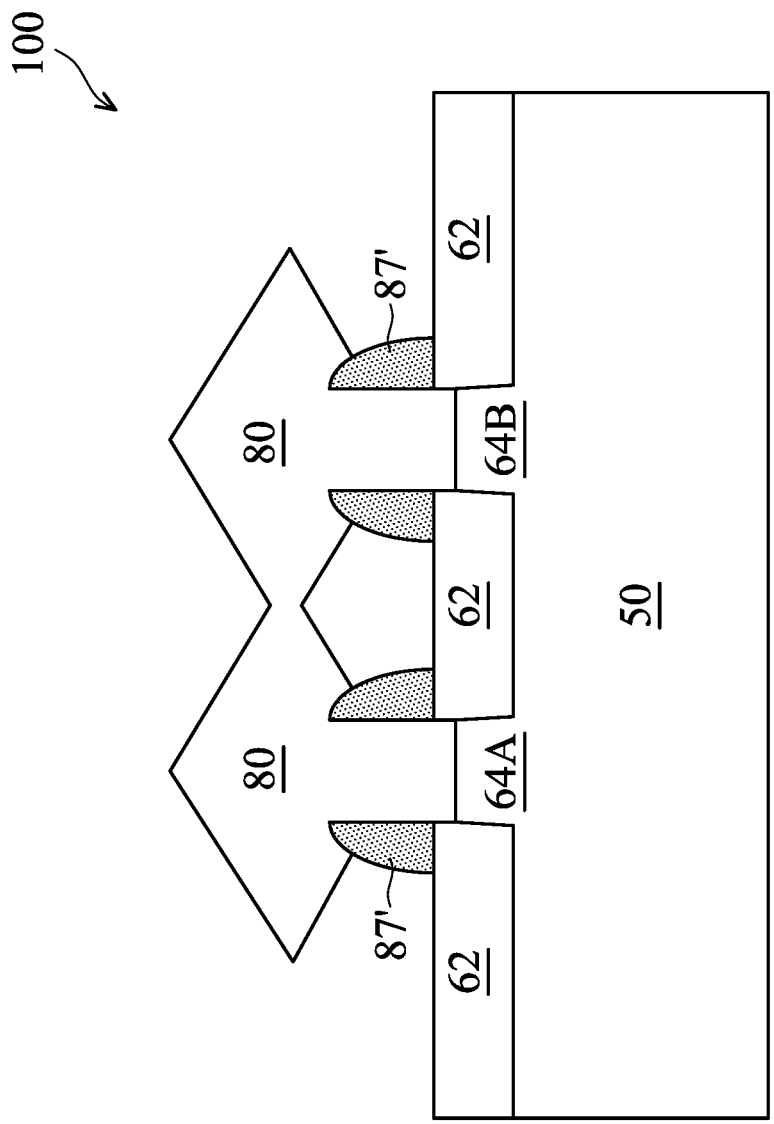
Figure 29A:
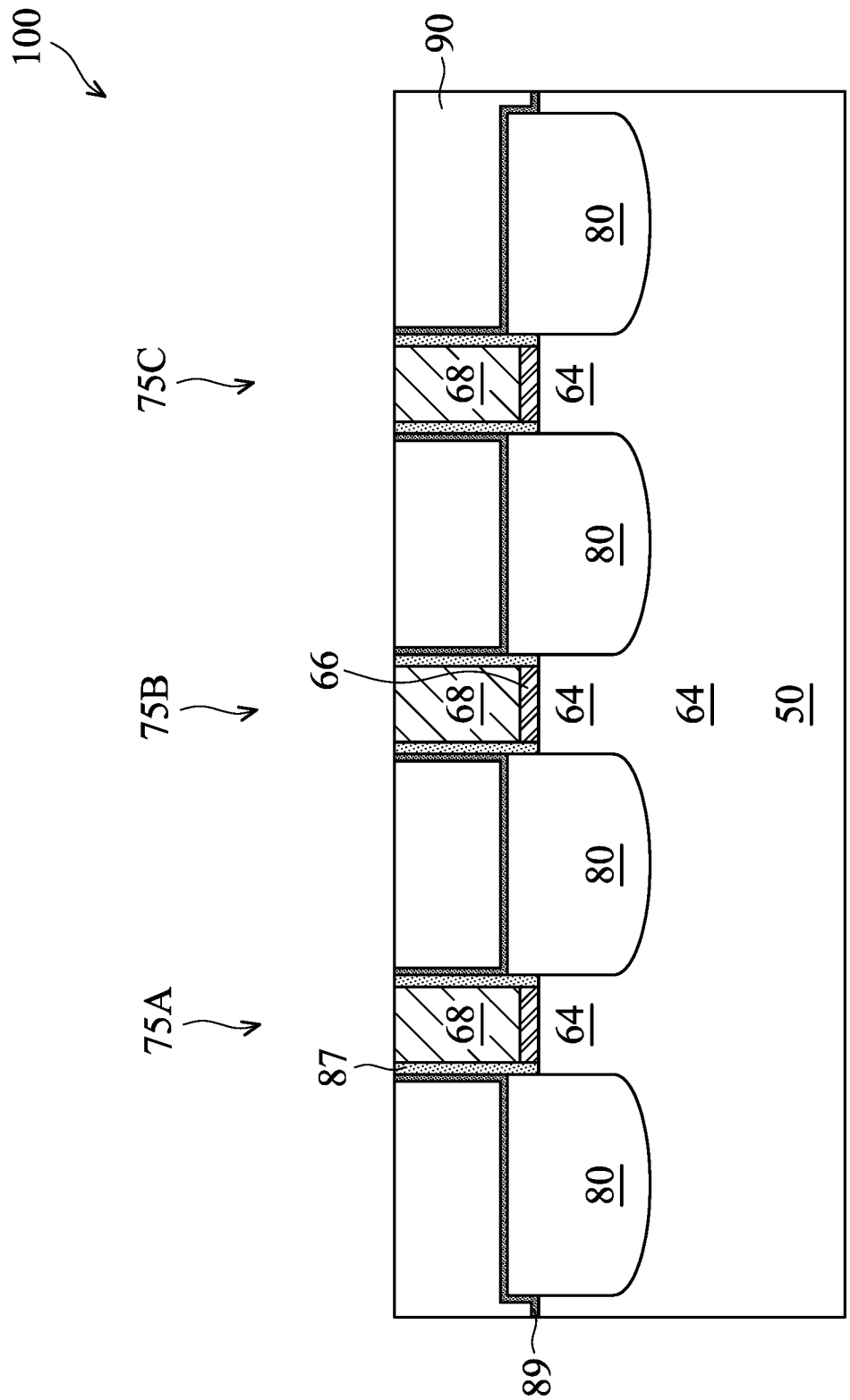
Figure 29B:
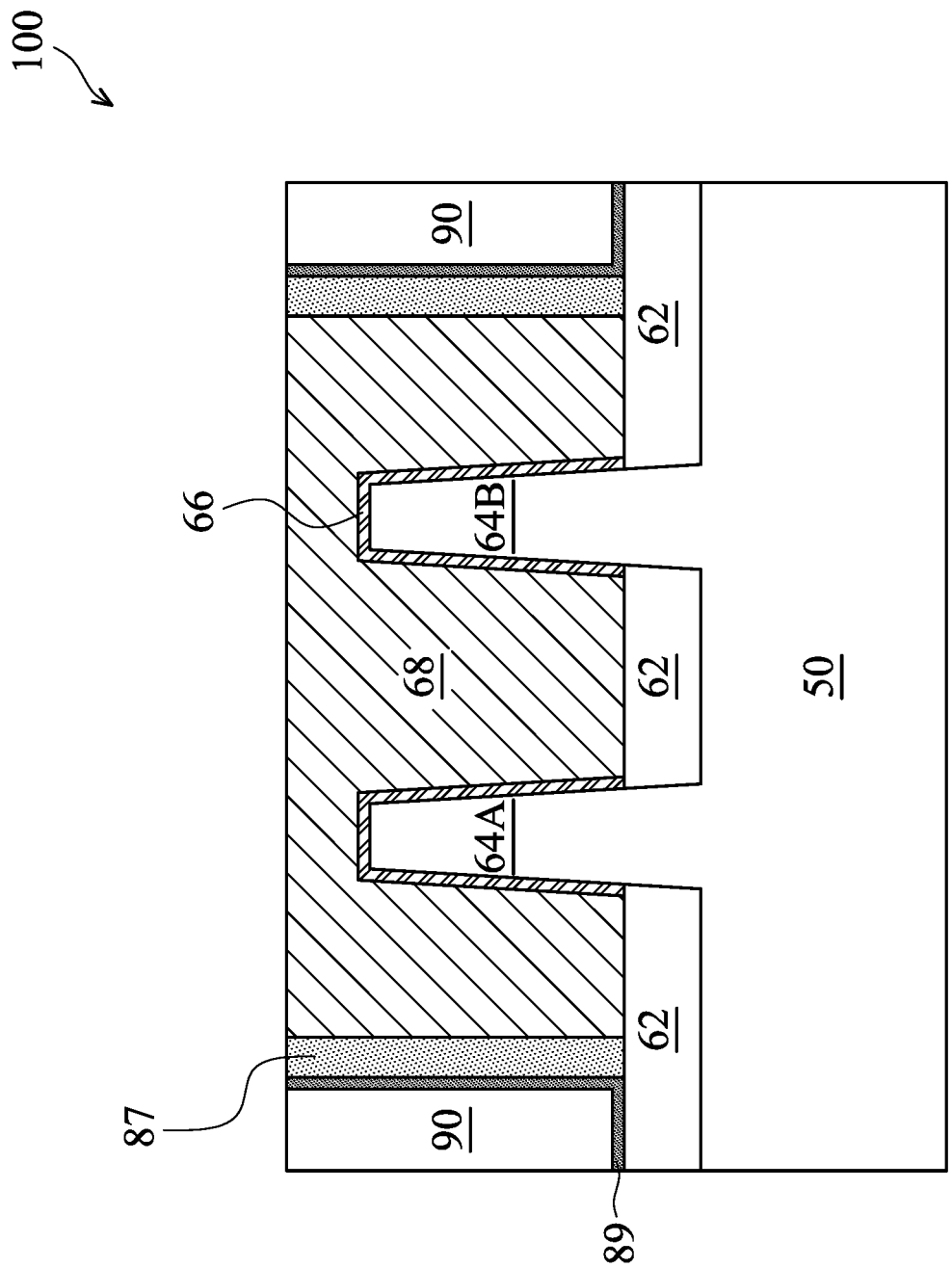
Figure 30:
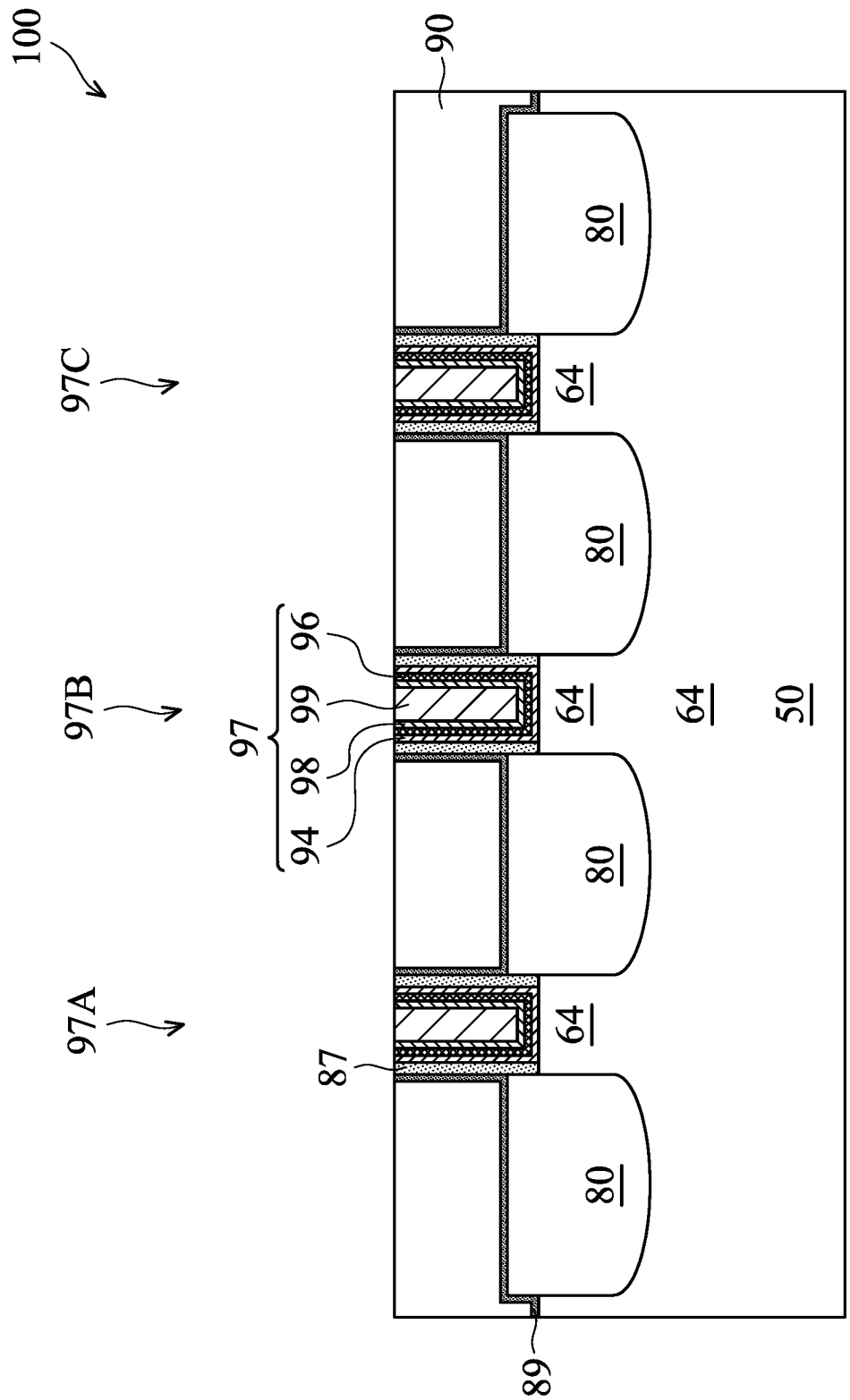
Figure 31:
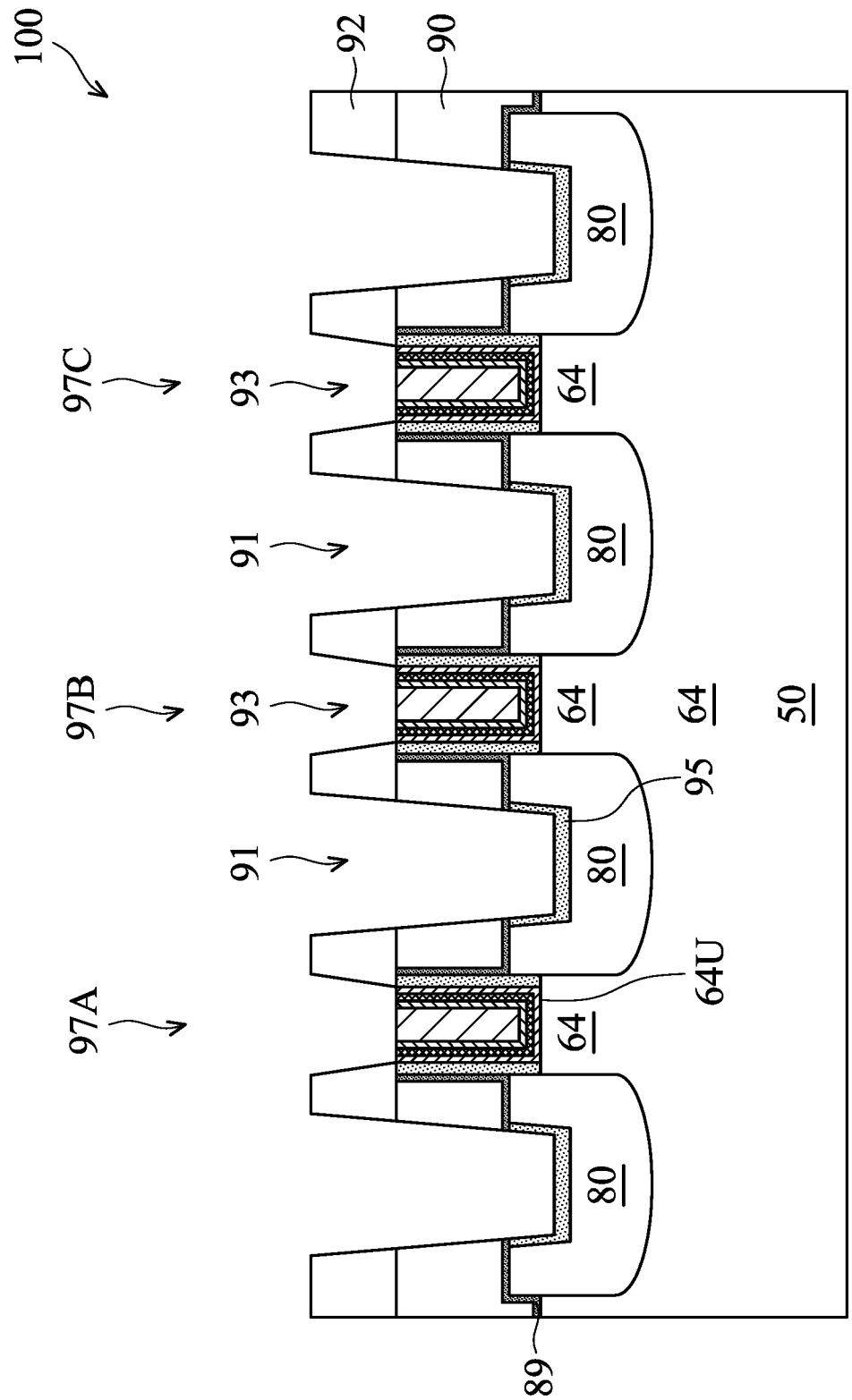
Figure 32A:
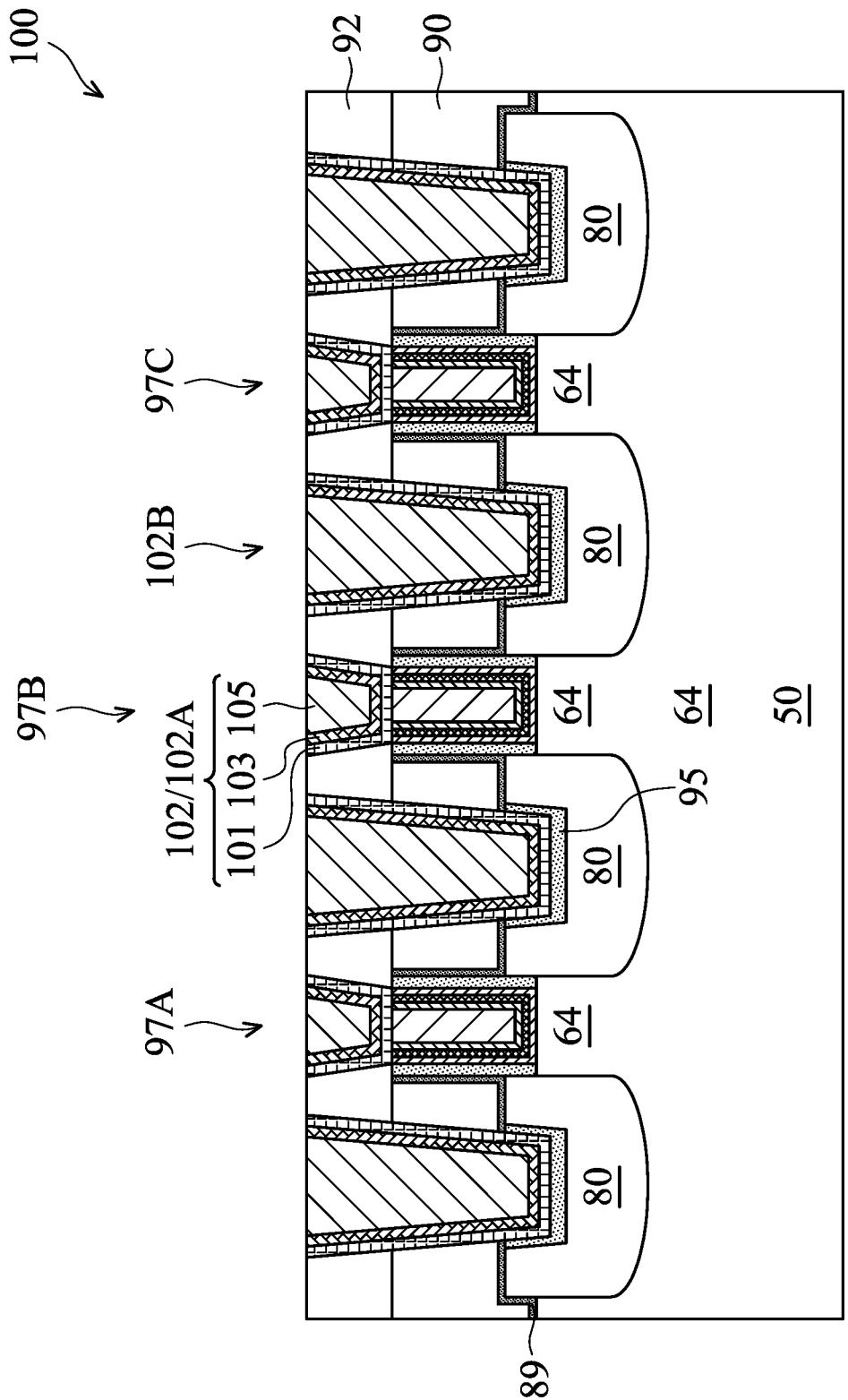
Figure 32B:
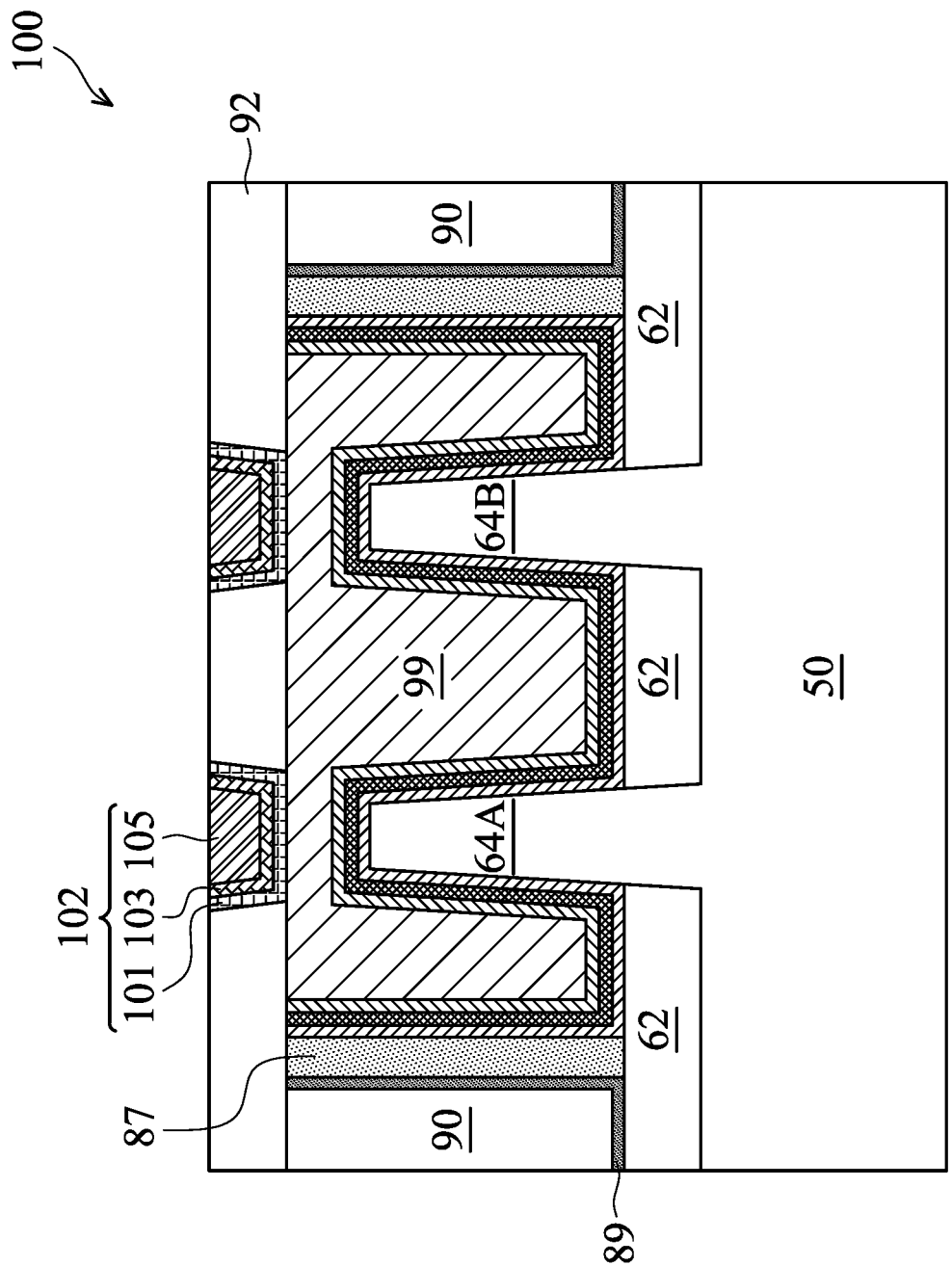

FIGS. 26, 27, 28A, 28B, 29A, 29B, 30, 31, 32A, and 32B illustrate cross-sectional views of the FinFET device 100 at additional stages of fabrication, following the processing of FIGS. 14A-14C, in accordance with an embodiment. FIGS. 26, 27, 28A, 29A, 30, 31, and 32A are cross-sectional views along cross-section A-A. FIG. 28B is a cross-sectional view along cross-section C-C. FIGS. 29B and 32B are cross-sectional views along cross-section B-B.

In FIG. 26, a spacer layer 87 is formed (e.g., conformally) over the dummy gate structures 75 (e.g., 75A, 75B, and 75C) and over the fins 64. The spacer layer 87 may be formed of a nitride, such as silicon nitride, silicon oxynitride, silicon carbonitride, the like, or a combination thereof, and may be formed using, e.g., a thermal oxidation, CVD, or other suitable deposition process. The example of FIG. 26 shows little or no fin loss after the multi-step plasma etching process. FIGS. 33-36 and the discussion therein show another embodiment where there is fin loss after the multi-step plasma etching process.

Next, as illustrated in FIG. 27, recesses 86 are formed in the fins 64 adjacent to the dummy gate structures 75, e.g., between adjacent dummy gate structures 75 and/or next to a dummy gate structure 75. The recesses 86 are formed by, e.g., an anisotropic etching process using the dummy gate structures 75 as an etching mask, in some embodiments, although any other suitable etching process may also be used. In some embodiments, the recesses 86 are formed by extending the recesses 65 (see, e.g., FIGS. 23-25) further into the fin 64.

Next, as illustrated in FIG. 28A, source/drain regions 80 are formed in the recesses 86. The source/drain regions 80 are formed by epitaxially growing a material in the recesses 88, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

Figure 28C:
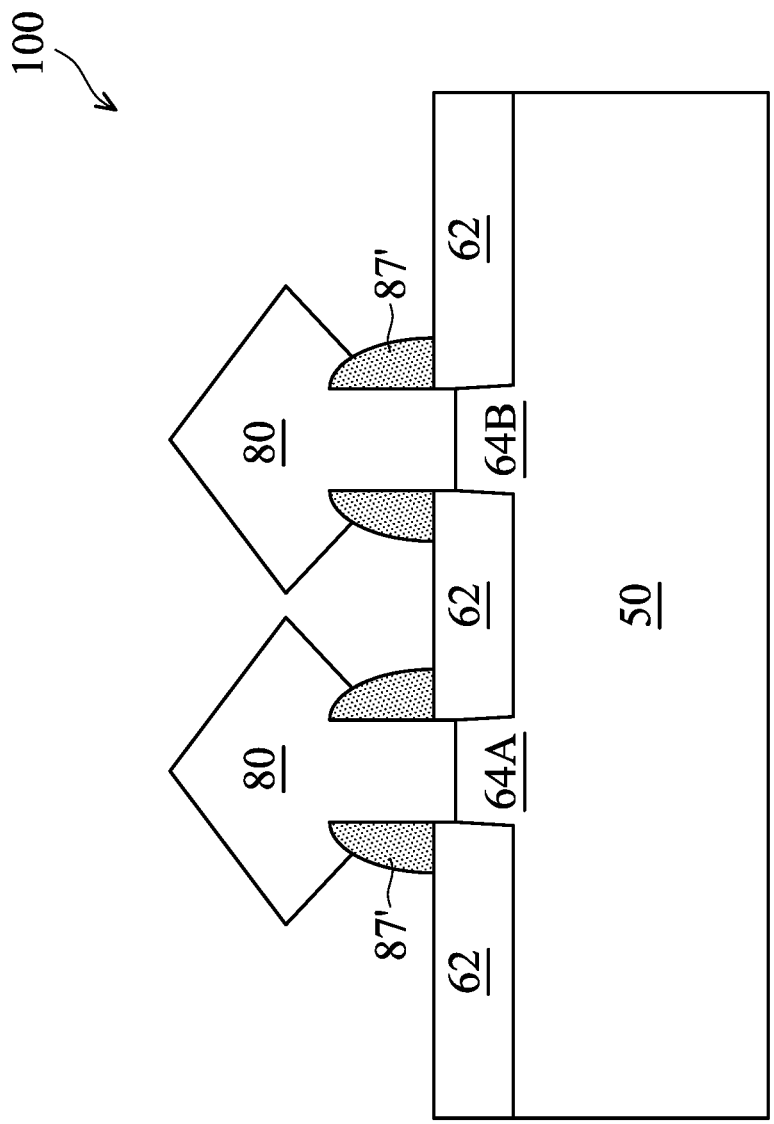
FIG. 28C illustrates an alternative embodiment cross-sectional view of the FinFET device 100 in FIG. 28A, in an embodiment.

As illustrated in FIG. 28A, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80 (see FIG. 28B). In some embodiments, the source/drain regions 80 for adjacent fins 64 do not merge together and remain separate source/drain regions 80 (see FIG. 28C). In some embodiments, the resulting FinFET is an n-type FinFET, and source/drain regions 80 comprise silicon carbide (SiC), silicon phosphorous (SiP), phosphorous-doped silicon carbide (SiCP), or the like. In some embodiments, the resulting FinFET is a p-type FinFET, and source/drain regions 80 comprise SiGe, and a p-type impurity such as boron or indium.

The epitaxial source/drain regions 80 may be implanted with dopants to form source/drain regions 80 followed by an anneal process. The implanting process may include forming and patterning masks such as a photoresist to cover the regions of the FinFET device 100 that are to be protected from the implanting process. The source/drain regions 80 may have an impurity (e.g., dopant) concentration in a range from about $1E19$ $cm^{-3}$ to about $1E21$ $cm^{-3}$. P-type impurities, such as boron or indium, may be implanted in the source/drain region 80 of a P-type transistor. N-type impurities, such as phosphorous or arsenide, may be implanted in the source/drain regions 80 of an N-type transistor. In some embodiments, the epitaxial source/drain regions may be in situ doped during growth.

Next, as illustrated in FIG. 29A, a contact etch stop layer (CESL) 89 is formed over the structure illustrated in FIG. 28A. The CESL 89 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, a first interlayer dielectric (ILD) 90 is formed over the CESL 89 and over the dummy gate structures 75 (e.g., 75A, 75B, and 75C). In some embodiments, the first ILD 90 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. A planarization process, such as a CMP process, may be performed to remove the mask 70 and to remove portions of the CESL 89 disposed over the gate 68. After the planarization process, the top surface of the first ILD 90 is level with the top surface of the gate 68.

FIG. 29B illustrates the cross-sectional view of the FinFET device 100 shown in FIG. 29A, but along cross-section B-B. As illustrated in FIG. 29B, the gate 68 is disposed over the fin 64A and the fin 64B, and extends continuously from the fin 64A to the fin 64B. The gate spacers 87 are formed between the gate 68 and the first ILD 90. An embodiment gate-last process (sometimes referred to as replacement gate process) is performed subsequently to replace the dummy gate 68 and the dummy gate dielectric 66 with an active gate (may also be referred to as a replacement gate or a metal gate) and active gate dielectric material(s).

Referring next to FIG. 30, the dummy gate structures 75A, 75B, and 75C are replaced by active gate structures 97A, 97B, and 97C, respectively. In accordance with some embodiments, to form the active gate structures 97 (e.g., 97A, 97B, or 97C), the gate 68 and the gate dielectric 66 directly under the gate 68 are removed in an etching step(s), so that recesses (not shown) are formed between the gate spacers 87. Each recess exposes the channel region of a respective fin 64. During the dummy gate removal, the dummy gate dielectric layer 66 may be used as an etch stop layer when the dummy gate 68 is etched. The dummy gate dielectric layer 66 may then be removed after the removal of the dummy gate 68.

Next, a gate dielectric layer 94, a barrier layer 96, a work function layer 98, and a gate electrode 99 are formed in the recesses for the replacement gates 97. The gate dielectric layer 94 is deposited conformally in the recesses, such as on the top surfaces and the sidewalls of the fins 64 and on sidewalls of the gate spacers 87, and on a top surface of the first ILD 90 (not shown). In accordance with some embodiments, the gate dielectric layer 94 comprises silicon oxide, silicon nitride, or multilayers thereof. In other embodiments, the gate dielectric layer 94 includes a high-k dielectric material, and in these embodiments, the gate dielectric layers 94 may have a k value greater than about 7.0, and may include a metal oxide or a silicate of Hf, Al, Zr, La, Mg, Ba, Ti, Pb, and combinations thereof. The formation methods of gate dielectric layer 94 may include molecular beam deposition (MBD), atomic layer deposition (ALD), PECVD, and the like.

Next, the barrier layer 96 is formed conformally over the gate dielectric layer 94. The barrier layer 96 may comprise an electrically conductive material such as titanium nitride, although other materials, such as tantalum nitride, titanium, tantalum, or the like, may alternatively be utilized. The barrier layer 96 may be formed using a CVD process, such as PECVD. However, other alternative processes, such as sputtering, metal organic chemical vapor deposition (MOCVD), or ALD, may alternatively be used.

Next, the work function layer 98, such as a P-type work function layer or an N-type work function layer, is formed in the recesses over the barrier layers 96. Exemplary P-type work function metals that may be included in the gate structures for P-type devices include TiN, TaN, Ru, Mo, A1, WN, $ZrSi_2$, $MoSi_2$, $TaSi_2$, $NiSi_2$, WN, other suitable P-type work function materials, or combinations thereof. Exemplary N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), and/or other suitable process.

Next, a seed layer (not shown) is formed conformally over the barrier layer 96. The seed layer may include copper, titanium, tantalum, titanium nitride, tantalum nitride, the like, or a combination thereof, and may be deposited by ALD, sputtering, PVD, or the like. In some embodiments, the seed layer is a metal layer, which may be a single layer or a composite layer comprising a plurality of sub-layers formed of different materials. For example, the seed layer comprises a titanium layer and a copper layer over the titanium layer.

Next, the gate electrode 99 is deposited over the seed layer, and fills the remaining portions of the recesses. The gate electrode 99 may be made of a metal-containing material such as Cu, Al, W, the like, combinations thereof, or multi-layers thereof, and may be formed by, e.g., electroplating, electroless plating, or other suitable method. After the formation of the gate electrode 99, a planarization process, such as a CMP, may be performed to remove the excess portions of the gate dielectric layer 94, the barrier layer 96, the work function layer 98, the seed layer, and the gate electrode 99, which excess portions are over the top surface of the first ILD 90. The resulting remaining portions of the gate dielectric layer 94, the barrier layer 96, the work function layer 98, the seed layer, and the gate electrode 99 thus form the replacement gates 97 of the resulting FinFET device 100.

Referring next to FIG. 31, a second ILD 92 is formed over the first ILD 90. Contact openings 93 are formed through the second ILD 92 to expose the replacement gates 97 (e.g., 97A, 97B, and 97C). Similarly, contact openings 91 are formed through the first ILD 90 and the second ILD 92 to expose the source/drain regions 80.

In an embodiment, the second ILD 92 is a flowable film formed by a flowable CVD method. In some embodiments, the second ILD 92 is formed of a dielectric material such as PSG, BSG, BPSG, USG, or the like, and may be deposited by any suitable method, such as CVD and PECVD. The contact openings 91 and 93 may be formed using photolithography and etching. The etching process etches through the CESL 89 to expose the source/drain regions 80. The etching process may over-etch, and therefore, the contact openings 91 may extends into the source/drain regions 80, and a bottom of the contact opening 91 may be level with (e.g., at a same level, or having a same distance from the substrate), or lower than (e.g., closer to the substrate), the upper surface 64U of the fin 64.

After the contact openings 91/93 are formed, silicide regions 95 are formed over the source/drain regions 80. In some embodiments, the silicide regions 95 are by first depositing a metal capable of reacting with semiconductor materials (e.g., silicon, germanium) to form silicide or germanide regions, such as nickel, cobalt, titanium, tantalum, platinum, tungsten, other noble metals, other refractory metals, rare earth metals or their alloys, over the exposed portions of the source/drain regions 80, then performing a thermal anneal process to form the silicide regions 95. The un-reacted portions of the deposited metal are then removed, e.g., by an etching process. Although regions 95 are referred to as silicide regions, regions 95 may also be germanide regions, or silicon germanide regions (e.g., regions comprising silicide and germanide).

Next, in FIG. 32A, contacts 102 (e.g., 102A, 102B, may also be referred to as contact plugs) are formed in the contact openings 91 and 93. Each of the contacts 102 includes a barrier layer 101, a seed layer 103, and a conductive material 105, and is electrically coupled to the underlying conductive feature (e.g., replacement gate 97, or silicide region 95), in the illustrated embodiment. The contacts 102A that are electrically coupled to the replacement gates 97 may be referred to as gate contacts, and the contacts 102B that are electrically coupled to the silicide regions 95 may be referred to as source/drain contacts. The materials and the formation methods for the barrier layers 101, the seed layer 103 and the conductive material 105 may be the same as or similar to those discussed above for the barrier layers 96, the seed layer, and the gate electrode 99 of the replacement gate 97, respectively, thus details are not repeated. In FIG. 32A, all of the contacts 102 are illustrated in a same cross-section for illustration purpose. This is, of course, an example and not limiting. The contacts 102 may be in different cross-sections.

FIG. 32B illustrates the FinFET device 100 of FIG. 32A, but along cross-section B-B. FIG. 32B illustrates a contact 102 over each of the fins 64A and 64B. The contacts 102 are electrically coupled to the replacement gate 97. The number and the locations of the contacts 102 are for illustration purpose only and not limiting, other numbers and other locations are also possible and are fully intended to be included within the scope of the present disclosure.

Figure 33:
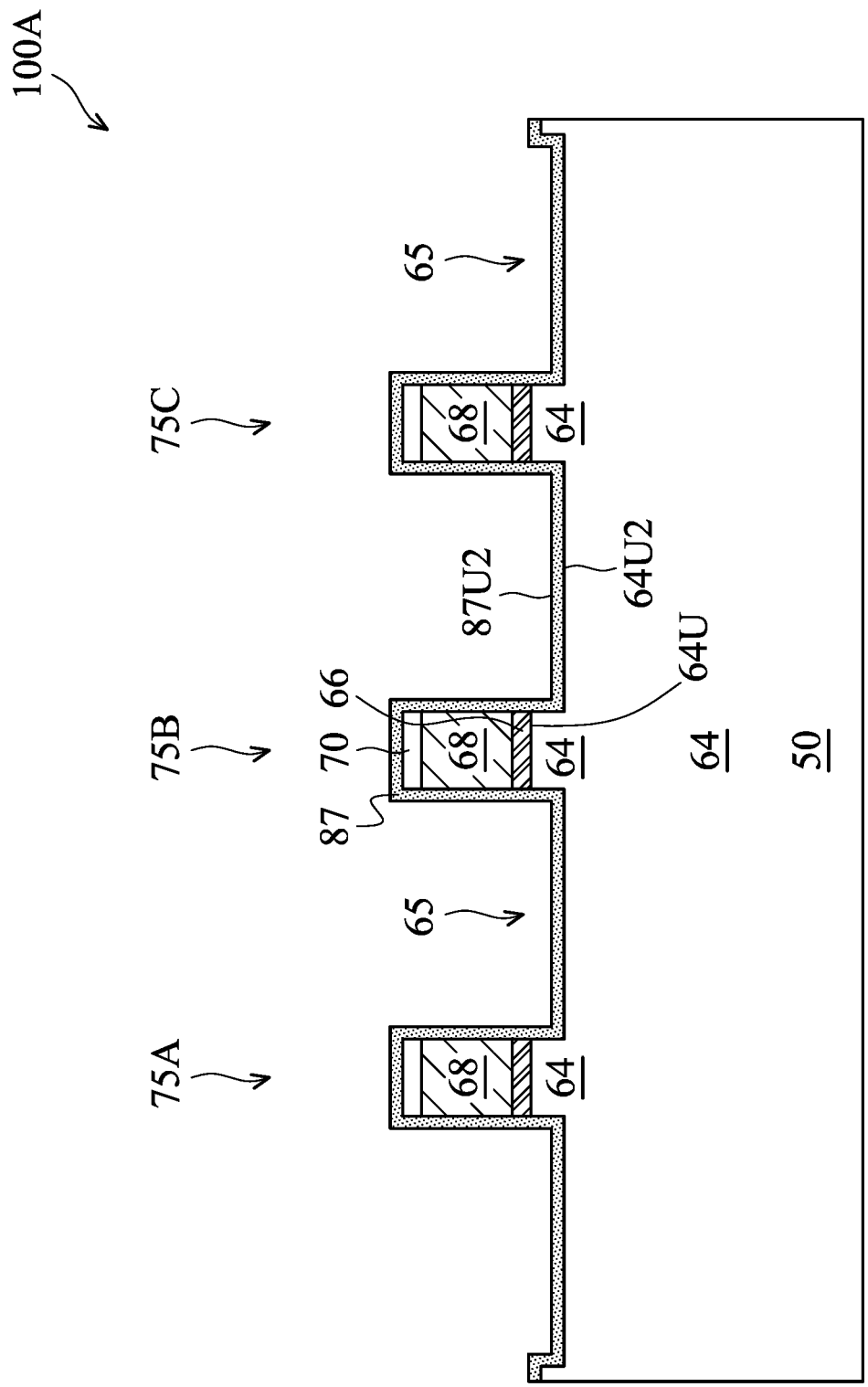
FIGS. 33-36 illustrate cross-sectional views of a FinFET device 100A at various stages of fabrication, in accordance with an embodiment.

FIGS. 33-36 illustrate cross-sectional views of a FinFET device 100A at various stages of fabrication, in accordance with an embodiment. The FinFET device 100A in FIG. 33 is similar to the FinFET device 100 in FIG. 26, but with fin loss in the fin 64 due to the multi-step plasma etching process to form the dummy gates 68. As a result of the fin loss, the recesses 65 extend below the upper surface 64U of the fin, and the spacer layer 87 also extends below the upper surface 64U.

Figure 34:
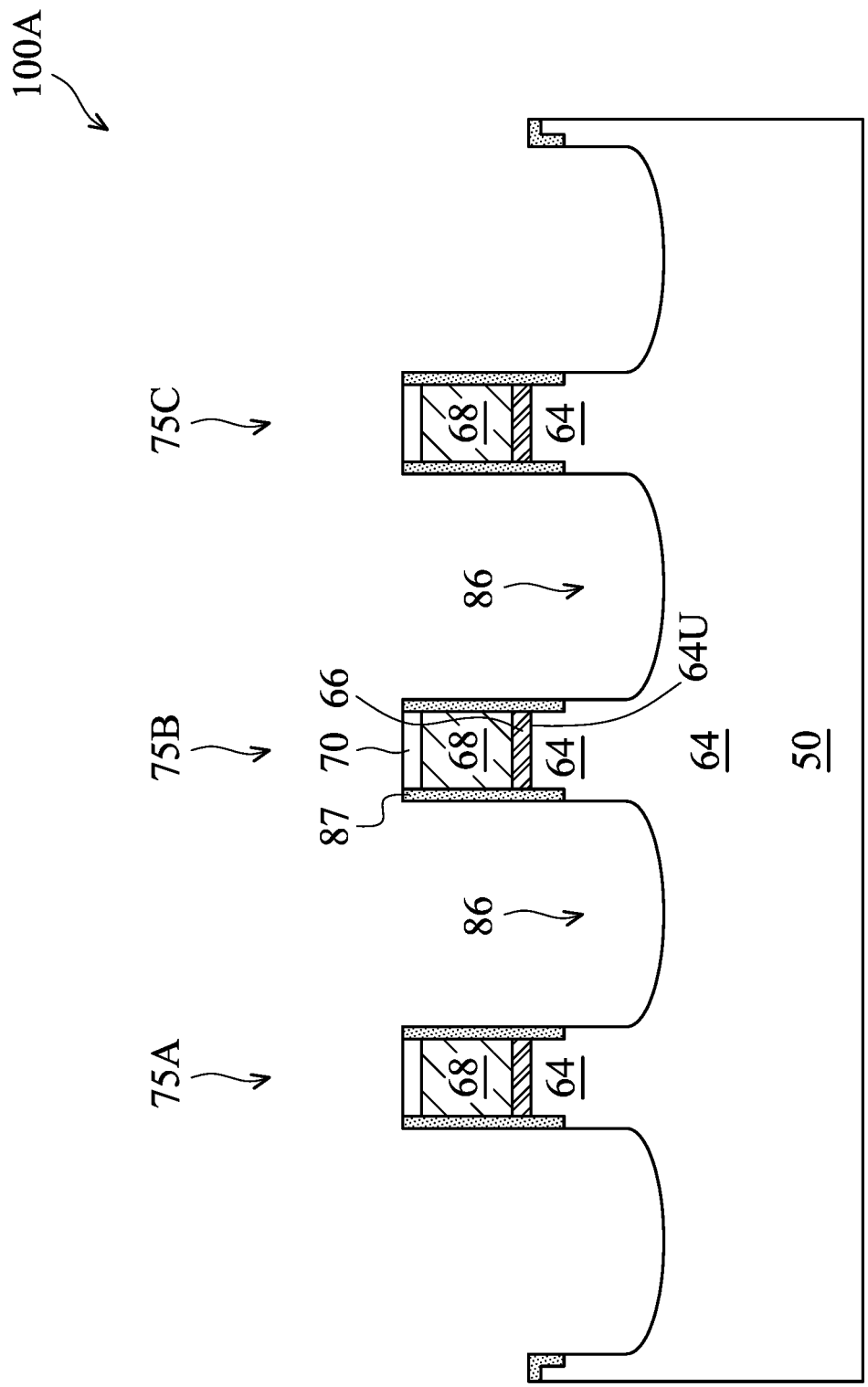

Next, in FIG. 34, an anisotropic etching process is performed to form gate spacers 87, and the recesses 65 are extended further into the fin 64 to form recesses 86. The processing is similar to those discussed above for the FinFET device 100, thus details are not repeated here.

Figure 35:
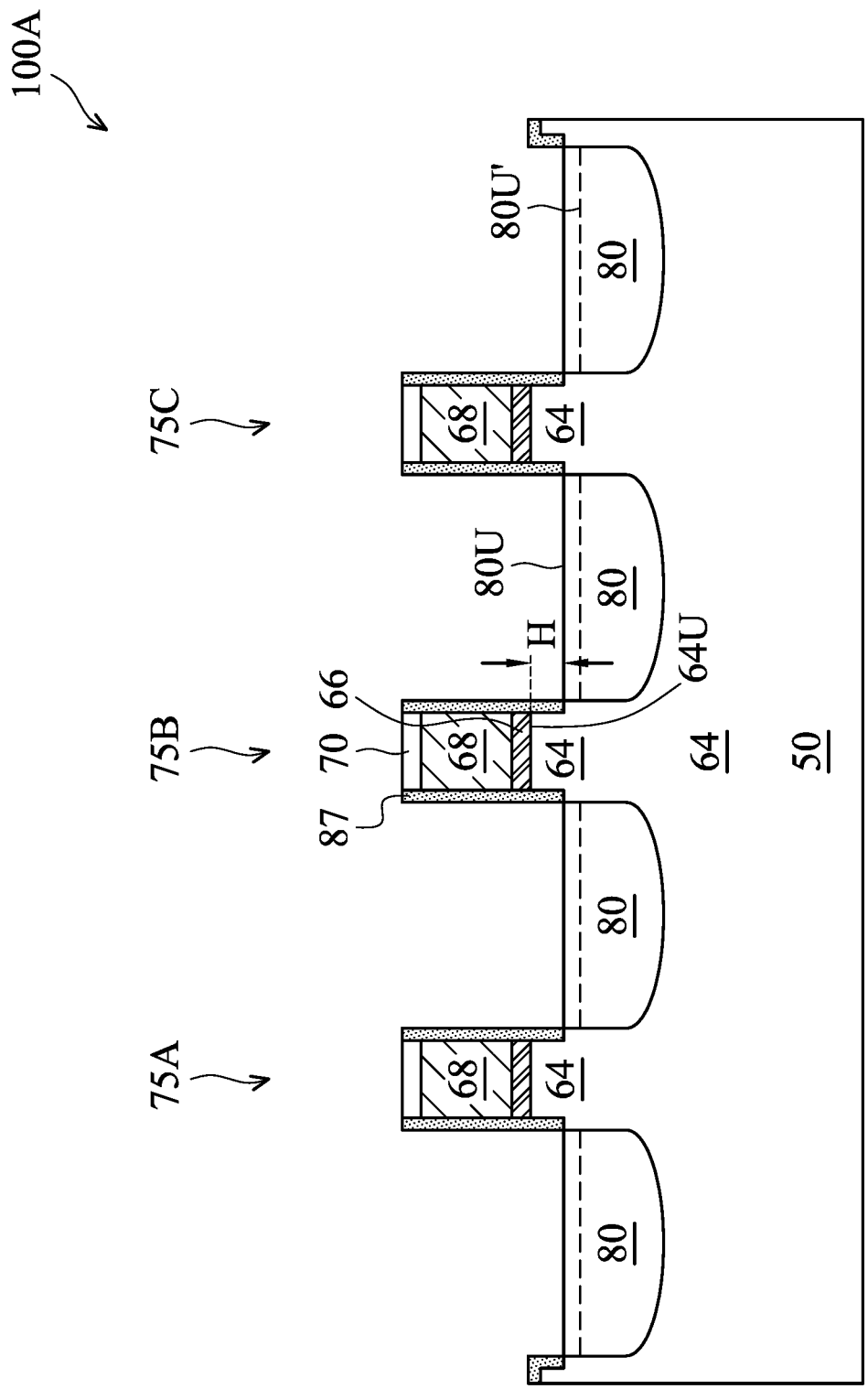

Next, in FIG. 35, epitaxial source/drain regions 80 are formed in the recesses 86. In the example of FIG. 35, the upper surface 80U of the source/drain regions 80 is below the upper surface 64U of the fin 64 by a distance H, and the volume of the source/drain regions 80 in FIG. 35 may be smaller than that in FIG. 28A. Therefore, the example in FIG. 35 illustrates an example of adjusting the volume of the source/drain regions 80 by adjusting the fin loss during formation of the dummy gates 68. In some embodiment, the distance H is between about 0 nm and about 5 nm. In some embodiments, the upper surface of 80U of the source/drain region 80 is substantially level with a bottom surface of the gate spacer 87 closest to the substrate 50. In some embodiments, the upper surface of the source/drain region 80 is below the bottom surface of the gate spacer 87, as illustrated by the dashed line 80U' in FIG. 35. In accordance with some embodiments, by limiting the epitaxial source/drain region 80 (e.g., by the STI boundaries and/or deeper gate spacer 87), the epitaxial structure of the source/drain region 80 may be formed with a more uniform size, thereby leading to a more uniform device performance for the device formed.

Figure 36:
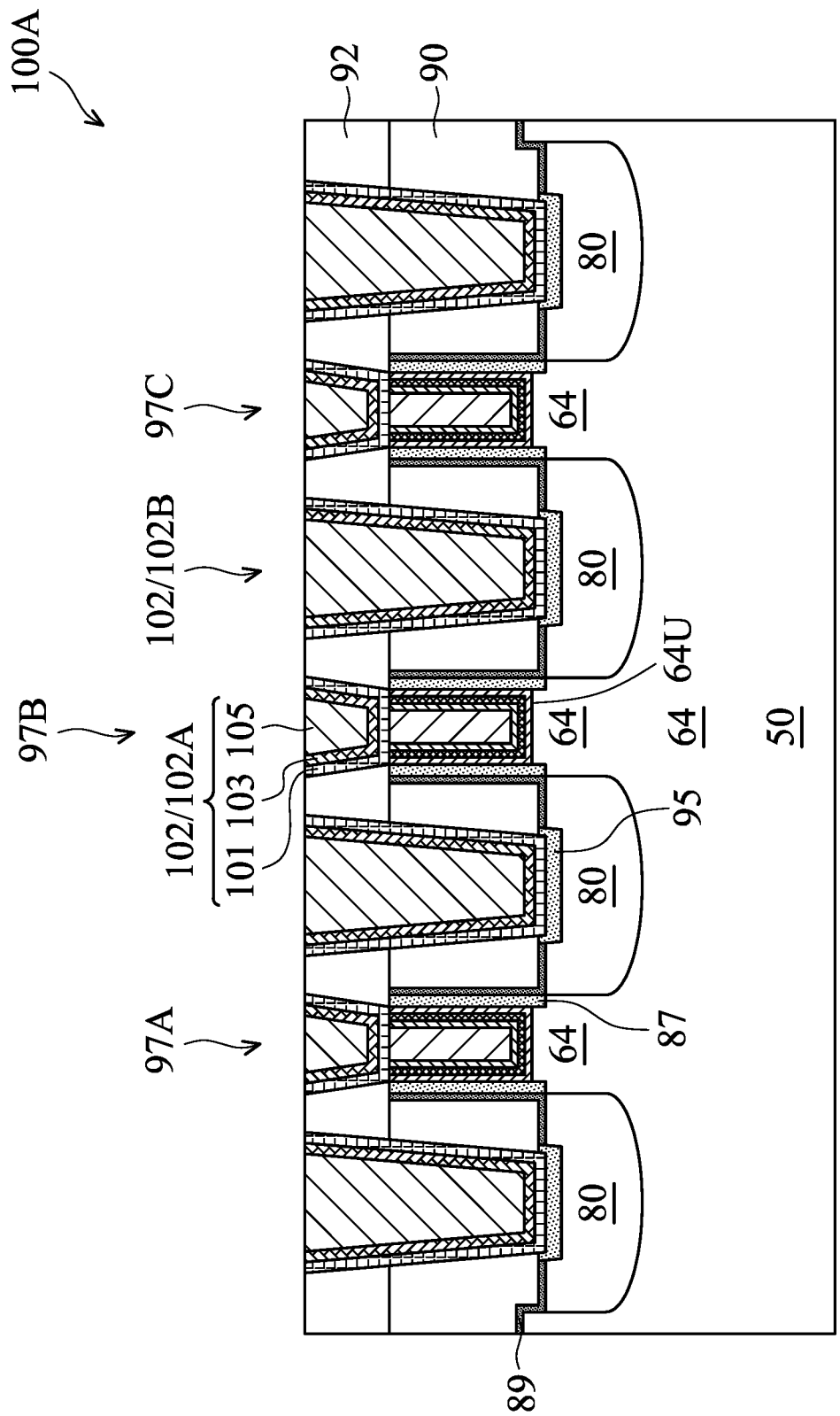

Next, in FIG. 36, the CESL 89, the first ILD 90, the second ILD 92, the silicide regions 95, and the contacts 102 are formed, similar to those discussed above for the FinFET device 100A.

Figure 37:
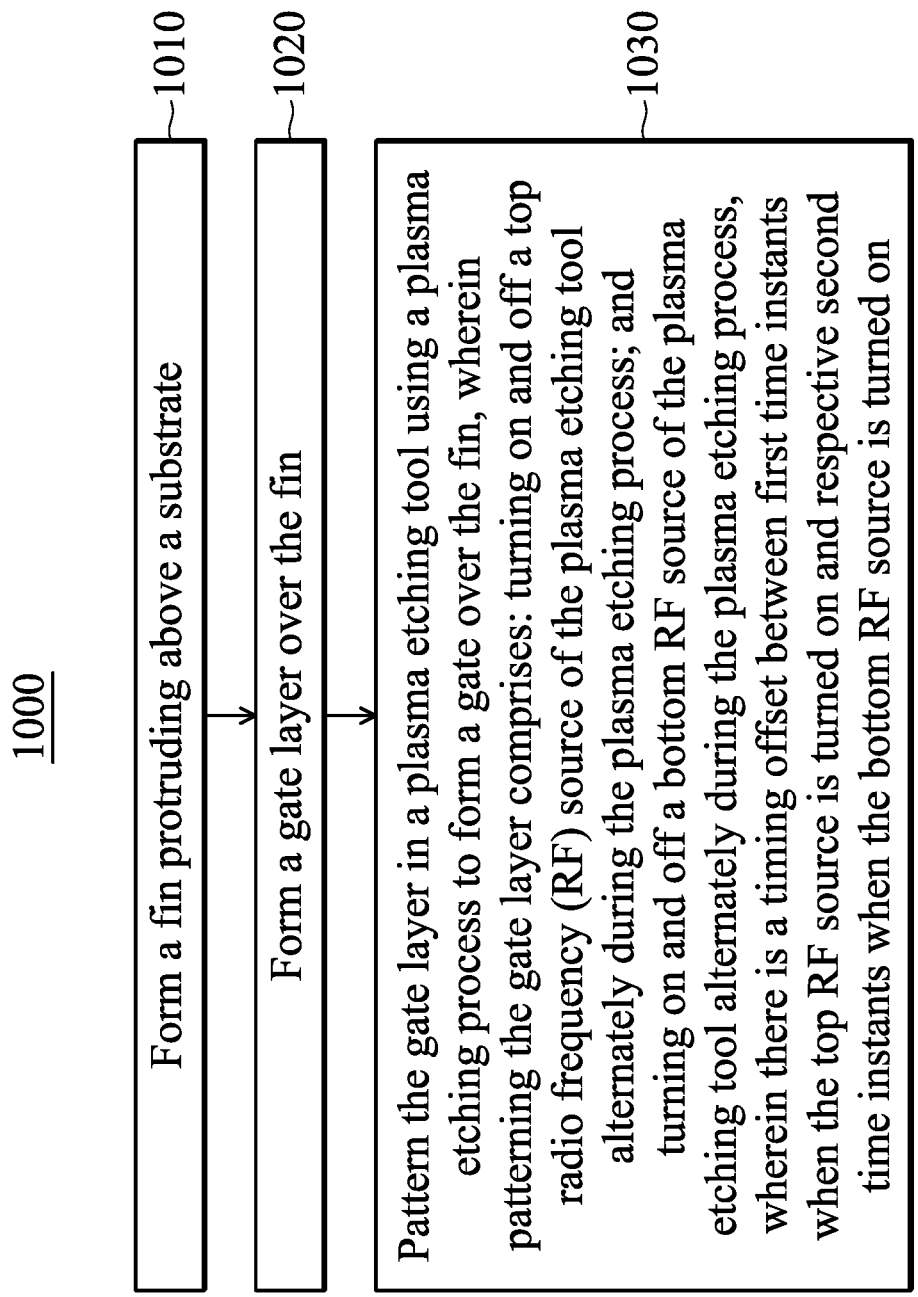
FIG. 37 illustrates a flow chart of method of making a semiconductor device, in accordance with some embodiments.

FIG. 37 illustrates a flow chart of a method 1000 of forming a semiconductor device, in accordance with some embodiments. It should be understood that the embodiment method shown in FIG. 37 is merely an example of many possible embodiment methods. One of ordinary skill in the art would recognize many variations, alternatives, and modifications. For example, various steps as illustrated in FIG. 37 may be added, removed, replaced, rearranged and repeated.

Referring to FIG. 37, at step 1010, a fin is formed protruding above a substrate. At step 1020, a gate layer is formed over the fin. At step 1030, the gate layer is patterned in a plasma etching tool using a plasma etching process to form a gate over the fin, wherein patterning the gate layer comprises: turning on and off a top radio frequency (RF) source of the plasma etching tool alternately during the plasma etching process; and turning on and off a bottom RF source of the plasma etching tool alternately during the plasma etching process, wherein there is a timing offset between first time instants when the top RF source is turned on and respective second time instants when the bottom RF source is turned on.

Embodiments may achieve advantages. For example, the disclosed methods for controlling the radio frequency (RF) power sources of the plasma etching tool provide extra tuning nobs for controlling the size and/or shape of the recesses (e.g., 65, 86) for epitaxial growth of the source/drain regions 80. In advanced semiconductor manufacturing, due to the small spacing between the gates 68, it is increasingly difficult to control the size and/or shape of the recesses. The disclosed methods herein allow extra control and flexibility in controlling the size and/or shape of the recesses while forming the gates 68, no extra processing is needed.

In an embodiment, a method of forming a semiconductor device includes: forming a fin protruding above a substrate; forming a gate layer over the fin; and patterning the gate layer in a plasma etching tool using a plasma etching process to form a gate over the fin, wherein patterning the gate layer comprises: turning on and off a top radio frequency (RF) source of the plasma etching tool alternately during the plasma etching process; and turning on and off a bottom RF source of the plasma etching tool alternately during the plasma etching process, wherein there is a timing offset between first time instants when the top RF source is turned on and respective second time instants when the bottom RF source is turned on. In an embodiment, the top RF source is configured to ignite a gas source in the plasma etching tool into a plasma when turned on, and wherein the bottom RF source is configured to provide a bias voltage for etching of the gate layer when turned on. In an embodiment, the gas source comprises hydrogen bromide and chlorine, wherein the method further comprises adjusting a sidewall profile of the gate by adjusting a flow ratio between hydrogen bromide and chlorine. In an embodiment, the method further includes controlling an amount of fin loss caused by the plasma etching process by adjusting a first duty cycle of the top RF source or by adjusting a second duty cycle of the bottom RF source. In an embodiment, the plasma etching process removes a top portion of the fin to form a recess in the fin, wherein the method further comprises: forming gate spacers along sidewalls of the gate and along sidewalls of the fin exposed by the recess; performing another plasma etching process to extend the recess further into the fin; and forming a source/drain region in the extended recess. In an embodiment, the method further includes: forming a dielectric material around the gate spacers and over the source/drain region; and replacing the gate with a metal gate. In an embodiment, the top RF source is turned on and off at a first frequency, and the bottom RF source is turned on and off at a second frequency that is a same as the first frequency. In an embodiment, during the plasma etching process, a first duty cycle of the top RF source is a same as a second duty cycle of the bottom RF source. In an embodiment, the timing offset is larger than an ON-time of the top RF source in a period of the plasma etching process, wherein the period of the plasma etching process is an inverse of the first frequency. In an embodiment, the timing offset is smaller than an ON-time of the top RF source in a period of the plasma etching process, wherein the period of the plasma etching process is an inverse of the first frequency. In an embodiment, during the plasma etching process, a first duty cycle of the top RF source is different from a second duty cycle of the bottom RF source.

In an embodiment, a method of forming a semiconductor device includes: forming a gate layer over a fin that protrudes above a substrate; forming a patterned mask over the gate layer; and etching the gate layer through the patterned mask to form a gate by performing a plasma etching process in a plasma etching tool, wherein the plasma etching tool has a top radio frequency (RF) power source configured to generate a plasma and has a bottom RF power source configured to provide a bias voltage for etching, wherein etching the gate layer comprises: switching on and off the top RF power source at a first frequency, wherein the top RF power source has a first duty cycle during the plasma etching process; and switching on and off the bottom RF power source at the first frequency, wherein the bottom RF power source has a second duty cycle during the plasma etching process. In an embodiment, during the plasma etching process, the top RF source is switched on at different time instants than the bottom RF power source. In an embodiment, the first duty cycle of the top RF power source is a same as the second duty cycle of the bottom RF power source. In an embodiment, the first duty cycle of the top RF power source is different from the second duty cycle of the bottom RF power source. In an embodiment, during the plasma etching process, a first time instant when the top RF power source is turned on precedes a nearest second time instant when the bottom RF power source is turned on. In an embodiment, the plasma etching process removes a top portion of the fin distal from the substrate to form a recess in the fin, wherein the method further comprises: deepening the recess into the fin by performing an etching process; and growing a source/drain material in the deepened recess.

In an embodiment, a semiconductor device includes: a fin protruding above a substrate; a gate structure over the fin; a gate spacer along a sidewall of the gate structure, wherein a bottom surface of the gate spacer facing the substrate extends closer to the substrate than an upper surface of the fin distal from the substrate; and a source/drain region at least partially in the fin and adjacent to the gate spacer. In an embodiment, the upper surface of the fin contacts a gate dielectric layer of the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a fin protruding above the substrate;
   a gate structure over the fin;
   a gate spacer along a sidewall of the gate structure, wherein a bottom surface of the gate spacer facing the substrate extends closer to the substrate than an upper surface of the fin distal from the substrate; and
   a source/drain region in the fin and adjacent to the gate spacer, wherein an upper surface of the source/drain region distal from the substrate is level with the bottom surface of the gate spacer.

2. The semiconductor device of claim 1, wherein the upper surface of the fin contacts a gate dielectric layer of the gate structure.

3. The semiconductor device of claim 1, wherein the upper surface of the source/drain region is closer to the substrate than the upper surface of the fin.

4. The semiconductor device of claim 3, wherein a width of the source/drain region, measured between opposing sidewalls of the source/drain region, is uniform.

5. The semiconductor device of claim 4, wherein the upper surface of the source/drain region is a flat surface.

6. The semiconductor device of claim 1, further comprising isolation regions over the substrate and on opposing sides of the fin, wherein the fin protrudes above the isolation regions.

7. The semiconductor device of claim 6, wherein the gate structure extends along the upper surface of the fin, along sidewalls of the fin, and along an upper surface of the isolation regions, wherein a width of the gate structure, measured between opposing sidewalls of the gate structure, has a first value at the upper surface of the fin, has a second value between the upper surface of the fin and the upper surface of the isolation regions, and has a third value at the upper surface of the isolation regions, wherein the first value, the second value, and the third value are different.

8. The semiconductor device of claim 7, wherein the first value is larger than the second value, and the second value is larger than the third value.

9. The semiconductor device of claim 7, wherein the first value is smaller than the second value, and the second value is smaller than the third value.

10. A semiconductor device comprising:
a fin protruding above a substrate;
isolation regions on opposing sides of the fin;
a gate structure over the fin, wherein the gate structure comprises:
a gate dielectric layer along a first upper surface of the fin and along sidewalls of the fin, wherein the first upper surface of the fin faces away from the substrate; and
a gate electrode over the gate dielectric layer;
gate spacers on opposing sides of the gate structure, wherein a lower surface of the gate spacers facing the substrate extends along a second upper surface of the fin, wherein the second upper surface of the fin faces away from the substrate, and is closer to the substrate than the first upper surface of the fin; and
source/drain regions on opposing sides of the gate structure.

11. The semiconductor device of claim 10, wherein an upper surface of the source/drain regions distal from the substrate is closer to the substrate than the first upper surface of the fin.

12. The semiconductor device of claim 10, wherein an upper surface of the source/drain regions distal from the substrate is flush with the lower surface of the gate spacers.

13. The semiconductor device of claim 10, wherein an upper surface of the source/drain regions distal from the substrate is closer to the substrate than the lower surface of the gate spacers.

14. The semiconductor device of claim 10, wherein a width of the gate structure, measured between the gate spacers, changes as the gate structure extends toward the isolation regions.

15. The semiconductor device of claim 14, wherein the width of the gate structure decreases as the gate structure extends toward the isolation regions.

16. The semiconductor device of claim 10, wherein the source/drain regions extend along a third upper surface of the fin, wherein the third upper surface of the fin faces away from the substrate, and is closer to the substrate than the second upper surface of the fin.

17. A semiconductor device comprising:
isolation regions over a substrate;
a fin over the substrate, wherein the fin protrudes above the isolation regions;
a gate structure over the fin, wherein the gate structure comprises:
a gate dielectric layer along a first upper surface of the fin and along first sidewalls of the fin, wherein the first upper surface of the fin faces away from the substrate; and
a gate electrode over the gate dielectric layer;
gate spacers on opposing sides of the gate structure, wherein the gate spacers extend along a second upper surface of the fin, wherein the second upper surface of the fin faces away from the substrate, and is closer to the substrate than the first upper surface of the fin; and
source/drain regions on opposing sides of the gate structure.

18. The semiconductor device of claim 17, wherein the second upper surface of the fin is connected to the first upper surface of the fin by second sidewalls of the fin, wherein the second sidewalls of the fin are perpendicular to the first sidewalls of the fin.

19. The semiconductor device of claim 17, wherein a width of the gate structure, measured between the gate spacers, changes as the gate structure extends toward the isolation regions.

20. The semiconductor device of claim 17, wherein a lower surface of the gate spacers contacts and extends along the second upper surface of the fin, wherein the lower surface of the gate spacers is level with an upper surface of the source/drain regions distal from the substrate.

* * * * *